US012416861B2

(12) United States Patent
Jiang et al.

(10) Patent No.: US 12,416,861 B2
(45) Date of Patent: Sep. 16, 2025

(54) ORGANOMETALLIC PHOTORESIST DEVELOPER COMPOSITIONS AND PROCESSING METHODS

(71) Applicant: Inpria Corporation, Corvallis, OR (US)

(72) Inventors: Kai Jiang, Corvallis, OR (US); Brian J. Cardineau, Corvallis, OR (US); Lauren B. McQuade, Albany, OR (US); Jeremy T. Anderson, Corvallis, OR (US); Stephen T. Meyers, Corvallis, OR (US); Michael Kocsis, Albany, OR (US); Amrit K. Narasimhan, Corvallis, OR (US)

(73) Assignee: Inpria Corporation, Corvallis, OR (US)

( * ) Notice: Subject to any disclaimer, the term of this patent is extended or adjusted under 35 U.S.C. 154(b) by 625 days.

(21) Appl. No.: 16/845,511

(22) Filed: Apr. 10, 2020

(65) Prior Publication Data
US 2020/0326627 A1    Oct. 15, 2020

Related U.S. Application Data

(60) Provisional application No. 62/833,343, filed on Apr. 12, 2019.

(51) Int. Cl.
*G03F 7/32*      (2006.01)
*G03F 7/16*      (2006.01)
*G03F 7/20*      (2006.01)
*G03F 7/40*      (2006.01)
*G03F 7/42*      (2006.01)

(52) U.S. Cl.
CPC .............. *G03F 7/325* (2013.01); *G03F 7/162* (2013.01); *G03F 7/2006* (2013.01); *G03F 7/40* (2013.01); *G03F 7/422* (2013.01)

(58) Field of Classification Search
CPC ...... G03F 7/0042; G03F 7/0043; G03F 7/325; G03F 7/32
See application file for complete search history.

(56) References Cited

U.S. PATENT DOCUMENTS

| 4,078,098 | A | * | 3/1978 | Cortellino ............... G03F 7/32 |
| | | | | 430/326 |
| 5,700,629 | A | | 12/1997 | Kakumaru |
| 8,822,129 | B2 | | 9/2014 | Iwato et al. |
| 9,176,377 | B2 | | 11/2015 | Stowers et al. |
| 9,281,207 | B2 | | 3/2016 | Stowers et al. |
| 9,310,684 | B2 | | 4/2016 | Meyers et al. |
| 9,372,402 | B2 | | 6/2016 | Freedman et al. |
| 9,778,561 | B2 | | 10/2017 | Marks et al. |
| 9,996,004 | B2 | | 6/2018 | Smith et al. |
| 10,228,618 | B2 | | 3/2019 | Meyers et al. |
| 10,627,719 | B2 | | 4/2020 | Waller et al. |
| 11,156,915 | B2 | | 10/2021 | Tsubaki et al. |
| 2002/0076495 | A1 | | 6/2002 | Maloney et al. |
| 2002/0164539 | A1 | | 11/2002 | MacDowell et al. |
| 2005/0250054 | A1 | | 11/2005 | Chang |
| 2010/0279228 | A1 | * | 11/2010 | Davis ............... G03F 7/0047 |
| | | | | 427/256 |
| 2011/0244403 | A1 | | 10/2011 | Carcasi et al. |
| 2011/0293888 | A1 | * | 12/2011 | Stowers .............. G03F 7/0043 |
| | | | | 430/296 |
| 2013/0224652 | A1 | | 8/2013 | Bass et al. |
| 2014/0212811 | A1 | | 7/2014 | Inoue et al. |
| 2015/0056542 | A1 | | 2/2015 | Meyers et al. |
| 2015/0079393 | A1 | | 3/2015 | Freedman et al. |
| 2015/0185620 | A1 | | 7/2015 | Liu et al. |
| 2015/0234272 | A1 | | 8/2015 | Sarma et al. |
| 2015/0323865 | A1 | | 11/2015 | Sagehashi et al. |
| 2015/0323866 | A1 | | 11/2015 | Namai et al. |
| 2016/0011505 | A1 | | 1/2016 | Stowers et al. |
| 2016/0116839 | A1 | | 4/2016 | Meyers et al. |
| 2016/0187783 | A1 | | 6/2016 | Kaur et al. |
| 2016/0216606 | A1 | | 7/2016 | Meyers et al. |
| 2017/0102612 | A1 | | 4/2017 | Meyers et al. |
| 2017/0146909 | A1 | | 5/2017 | Smith et al. |
| 2018/0046086 | A1 | | 2/2018 | Waller et al. |
| 2018/0173096 | A1 | | 6/2018 | Zi et al. |

(Continued)

FOREIGN PATENT DOCUMENTS

CN      1407410 S       4/2003
JP      2013-080004 A   5/2013
(Continued)

OTHER PUBLICATIONS

Chandrasekhar et al., "Organotin assemblies containing Sn-O bonds", Coord. Chem. Rev., vol. 235, p. 1-52, (2002).
Pleasseraud et al., "Di-nbutyltin oxide as a chemical carbon dioxide capturer", J. Organometallic Chem., vol. 695, p. 1618-1626, (2010). (Abstract).
Pleasseraud et al., "Unprecedented Hexa- and Undecanuclear Frameworks of Two New Tin(IV) Oxo Clusters Resulting from Partial Debenzylation Reactions", Z. Naturforsch, vol. 65b, p. 1293-1300, (2010).
Pleasseraud et al., "A New Dodecanuclear Organostannoxane", Z. Naturforsch, vol. 66b, p. 262-268, (2011).
Zheng et al., "A New System in Organooxotin Cluster Chemistry Incorporating Inorganic and Organic Spacers between Two Ladders Each Containing Five Tin Atoms", Chem. Eur. J., vol. 10, p. 3761-3768, (2010). (abstract).

(Continued)

*Primary Examiner* — Daborah Chacko-Davis
(74) *Attorney, Agent, or Firm* — Christensen, Fonder, Dardi PLLC; Diane E. Bennett; Peter S. Dardi

(57)    ABSTRACT

Developer compositions are described based on blends of solvents, in which the developers are particularly effective for EUV patterning using organometallic based patterning compositions. Methods for use of these developing compositions are described. The blends of solvents can be selected based on Hansen solubility parameters. Generally, one solvent has low polarity as express by the sum of δP+δH, and a second solvent component of the developer has a higher value of δP+δH. Corresponding solvent compositions are described.

20 Claims, 23 Drawing Sheets

(56) References Cited

U.S. PATENT DOCUMENTS

| | | | |
|---|---|---|---|
| 2018/0321589 A1 | 11/2018 | Tsuchimura et al. | |
| 2019/0053001 A1 | 2/2019 | Tanabe et al. | |
| 2019/0137870 A1 | 5/2019 | Meyers et al. | |
| 2019/0308998 A1 | 10/2019 | Cardineau et al. | |
| 2019/0315782 A1 | 10/2019 | Edson et al. | |
| 2020/0124970 A1 | 4/2020 | Kocsis et al. | |
| 2021/0026241 A1 | 1/2021 | Cardineau et al. | |

FOREIGN PATENT DOCUMENTS

| | | | |
|---|---|---|---|
| KR | 10-2015-0039719 A | 4/2015 | |
| KR | 10-2018-0054917 A | 5/2018 | |
| WO | 00-012231 A1 | 3/2000 | |
| WO | 2004-073036 A2 | 8/2004 | |
| WO | 2014-132992 A | 9/2014 | |
| WO | 2017-138267 A1 | 8/2017 | |
| WO | 2017-163922 A1 | 9/2017 | |
| WO | 2017-164018 A1 | 9/2017 | |
| WO | 2019-060570 A1 | 3/2019 | |
| WO | 2019-217749 A1 | 11/2019 | |
| WO | 2020-132281 A1 | 6/2020 | |
| WO | 2020-264556 A1 | 12/2020 | |
| WO | 2020-264571 A1 | 12/2020 | |
| WO | 2021-016229 A1 | 1/2021 | |
| WO | 2021-072042 A1 | 4/2021 | |

OTHER PUBLICATIONS

International Search Report And Written Opinion for Application No. PCT/US2020/027713 dated Aug. 3, 2020.

Hotalen et al., "Advanced Development Techniques for Metal-Based EUV Resists", Proc. of SPIE vol. 10143 1014309-1, Mar. 6, 2020.

Azuma et al., "Effects of Low-level inhalation exposure to carbon dioxide in indoor environments: A short review on human health and psychomotor performance", Environment International, vol. 121, p. 51-56, (2018).

Kenane, "Chemistry of High-Resolution Organotin Patterning Materials", An Abstract of the Dissertation, (2020).

Thornton et al., "Surface Hydroxyl Groups and the Chemisorption of Carbon Dioxide and Carbon Monoxide on Tin (v) Oxide" Journal of the Chemical Society, Faraday Transactions 1: Physical Chemistry in Condensed Phases, p. 461-472, (1975).

Office Action from corresponding Korean Patent Application No. 10-2021-7034862 dated Sep. 6, 2023. (Microsoft Word translation).

Office Action from corresponding Japanese Patent Application No. 2023-119291 dated Jun. 11, 2024.

Search Report from corresponding European Patent Application No. 20787220 dated May 8, 2023.

* cited by examiner

| PEB Temperature (°C) | Developer Solution | | | |
|---|---|---|---|---|
| | HF0 | PF0 | HF2 | PF2 |
| 140 | 42.6 / 15.9 / 3.8 | 36.7 / 15.8 / 4.2 | 68.3 / 16.1 / 3.7 | 64.4 / 15.8 / 3.5 |
| 160 | 39.0 / 16.2 / 3.6 | 33.6 / 15.9 / 4.3 | 58.9 / 16.0 / 3.6 | 55.5 / 15.7 / 3.7 |
| 180 | 29.9 / 16.1 / 4.1 | 28.1 / 15.8 / 4.6 | 43.8 / 15.9 / 3.9 | 42.6 / 16.0 / 4.0 |

FIG. 10

| HF0 | HF1 | HF2 | HF3 | HF4 |
|---|---|---|---|---|
| 29.9 / 16.1 / 4.1 | 41.3 / 15.8 / 4.0 | 43.8 / 15.9 / 3.9 | 45.2 / 15.8 / 4.0 | 47.9 / 15.9 / 3.8 |
| PF0 | PF1 | PF2 | PF3 | PF4 |
| 28.1 / 15.8 / 4.6 | 39.0 / 16.0 / 3.9 | 42.6 / 16.0 / 4.0 | 43.8 / 15.9 / 3.9 | 45.2 / 15.8 / 3.9 |

FIG. 11

| PEB (°C) | HF0 | PG0 | NP0 |
|---|---|---|---|
| 160 | 34.6 / 15.9 / 4.3 | 42.6 / 15.9 / 3.8 | 46.5 / 16.0 / 4.0 |
| 180 | 27.3 / 15.9 / 4.8 | 31.7 / 16.1 / 4.4 | 34.6 / 16.0 / 4.5 |

FIG. 20 ns and materials disclosed herein enable the formation of high-fidelity patterns and structures with improved, i.e., reduced, pattern defect density, such as microbridging, in lithographic processing of organometallic photoresists.

ORGANOMETALLIC PHOTORESIST DEVELOPER COMPOSITIONS AND PROCESSING METHODS

CROSS REFERENCE TO RELATED APPLICATIONS

This application claims priority to U.S. provisional patent application 62/833,343 to Jiang et al., entitled "Organometallic Photoresist Developer Compositions," incorporated herein by reference.

FIELD OF THE INVENTION

The invention relates to improved processing of organometallic based radiation patterning compositions to reduce defects. In particular, improved chemical developing compositions are described to reduce microbridges and similar defects. Post development rinses to decrease defects are also described.

BACKGROUND OF THE INVENTION

For the formation of semiconductor-based devices as well as other electronic devices or other complex fine structures, materials are generally patterned to integrate the structure. Thus, the structures are generally formed through an iterative process of sequential deposition and etching steps through which a pattern is formed of the various materials. In this way, a large number of devices can be formed into a small area. Some advances in the art can involve that reduction of the footprint for devices, which can be desirable to enhance performance.

Organic compositions can be used as radiation patterned resists so that a radiation pattern is used to alter the chemical structure of the organic compositions corresponding with the pattern. For example, processes for the patterning of semiconductor wafers can entail lithographic transfer of a desired image from a thin film of organic radiation-sensitive material. The patterning of the resist generally involves several steps including exposing the resist to a selected energy source, such as through a mask, to record a latent image and then developing and removing selected regions of the resist. For a positive-tone resist, the exposed regions are transformed to make such regions selectively removable, while for a negative-tone resist, the unexposed regions are more readily removable.

Generally, the pattern can be developed with radiation, a reactive gas, or liquid solution to remove the selectively sensitive portion of the resist while the other portions of the resist act as a protective etch-resistant layer. Liquid developers can be particularly effective for developing the latent image. The substrate can be selectively etched through the windows or gaps in the remaining areas of the protective resist layer. Alternatively, materials can be deposited into the exposed regions of the underlying substrate through the developed windows or gaps in the remaining areas of the protective resist layer. Ultimately, the protective resist layer is removed. The process can be repeated to form additional layers of patterned material. The materials can be deposited using chemical vapor deposition, physical vapor deposition, spin coating, or other desired approaches. Additional processing steps can be used, such as the deposition of conductive materials or implantation of dopants. In the fields of micro- and nanofabrication, feature sizes in integrated circuits have become very small to achieve high-integration densities and improve circuit function.

SUMMARY OF THE INVENTION

The compositions and materials disclosed herein enable the formation of high-fidelity patterns and structures with improved, i.e., reduced, pattern defect density, such as microbridging, in lithographic processing of organometallic photoresists.

In a first aspect, the invention pertains to a method for developing a radiation exposed organometallic patterning layer to form a developed patterned layer comprising an organometallic oxide/hydroxide network, the method comprising contacting the radiation exposed organometallic patterning layer with a developer composition comprising a solvent blend. The solvent blend can comprise at least two solvents with at least 55 volume % of one or more solvents each independently having a sum of Hansen solubility parameter $\delta H+\delta P$ of no more than about 16 $(J/cm^3)^{1/2}$, and with from about 0.25 volume % to about 45 volume % of one or more solvents each independently having a sum of Hansen solubility parameter $\delta H+\delta P$ of at least about 16 $(J/cm^3)^{1/2}$.

In a further aspect, the invention pertains to a method for developing a radiation exposed organometallic patterning layer comprising an organometallic oxide/hydroxide network, the method comprising contacting the radiation exposed organometallic patterning layer with a developer composition comprising a solvent blend with from about 0.25 volume percent to about 45 volume percent water, alcohol, glycol ether, pyrrolidone, lactone, carboxylic acid or a combination thereof, and at least 55 volume percent ketone, ether, ester, or combinations thereof.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

FIG. 10 is an array of 12 scanning electron micrograph (SEM) images of a silicon substrate with organometallic resist patterned via EUV lithography to form 32-nm pitch lines with each image from the field with an average line CD closest to 16 nm with the top row of four SEM images corresponding to a post-exposure bake (PEB) temperature of 140° C., with the second row of four SEM images corresponding to processing with a PEB temperature of 160° C., with the bottom row of four SEM images corresponding to processing with a PEB temperature of 180° C., in which the four images in each row from left to right correspond to developing with 2-heptanone (HF0), PGMEA (PF0), 10 vol % formic acid in 2-heptanone (HF2), and 10 vol % formic acid in PGMEA (PF2), respectively.

FIG. 11 is an array of 10 scanning electron micrograph (SEM) images of a silicon substrate with organometallic resist patterned via EUV lithography to form 32-nm pitch lines with each image from the field with an average line CD closest to 16 nm with the top row of five SEM images from left to right corresponding to developing with 2-heptanone (HF0), 5 vol % formic acid in 2-heptanone (HF1), 10 vol % formic acid in 2-heptanone (HF2), 15 vol % formic acid in 2-heptanone (HF3), 20 vol % formic acid in 2-heptanone (HF4), and the bottom row of five images from left to right corresponding to developing with PGMEA (PF0), 5 vol % formic acid in PGMEA (PF1), 10 vol % formic acid in PGMEA (PF2), 15 vol % formic acid in PGMEA (PF3), 20 vol % formic acid in PGMEA (PF4), respectively.

FIG. 20 is an array of 6 scanning electron micrograph (SEM) images of a silicon substrate with organometallic resist patterned via EUV lithography to form 32-nm pitch lines with each image from the field with an average line CD closest to 16 nm with the top row of three SEM images corresponding to a post-exposure bake (PEB) temperature of 160° C. and the bottom row of three SEM images corresponding to processing with a PEB temperature of 180° C., in which the three images in each row from left to right correspond to developing with 2-heptanone (HF0), PGMEA (PF0), PGME (PG0), and n-propanol (NP0), respectively.

DETAILED DESCRIPTION OF THE INVENTION

Figure 1:
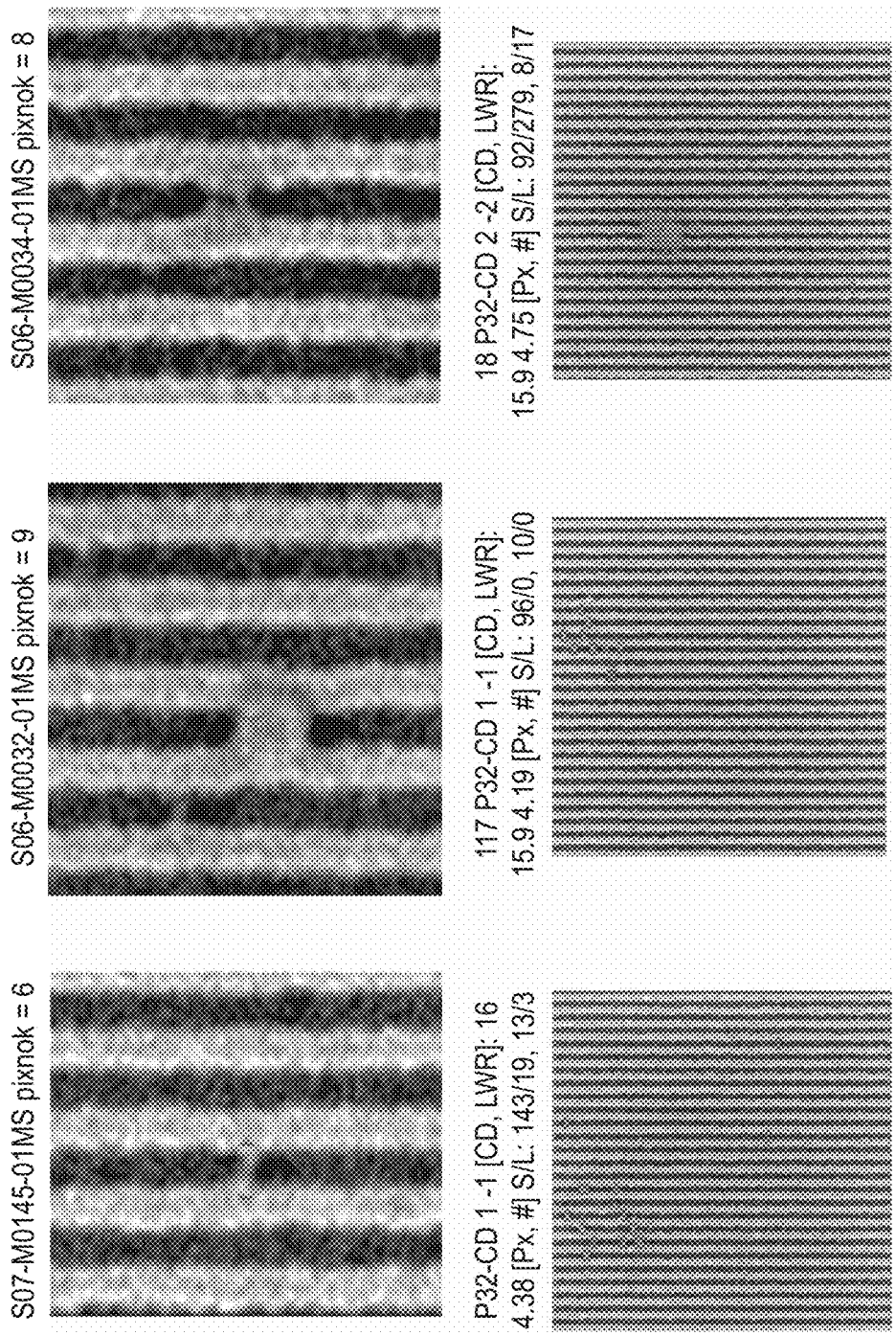
FIG. 1 is a set of six scanning electron micrograph (SEM) images of 32-nm pitch lines with 16-nm spacing patterned via EUV lithography with the bottom left, bottom middle, and bottom right images showing microbridge defects and the top left, top middle, top right images showing magnified views of the microbridge defects in the corresponding bottom images.

Improved solutions as developers for organometallic photoresists have been discovered that reduce patterned defect densities. Developer solution compositions are generally chosen for their ability to enable high solubility contrast between exposed and unexposed regions of a photoresist. In other words, developers are able to effectively translate an exposure-induced latent image within the photoresist coating into a physical pattern. The developer compositions described herein comprise a majority organic solvent, which provides the baseline negative-tone development of the exposed organometallic resists, and selected additives that have been discovered to improve pattern defectivity. In some embodiments, an amount of water, generally less than 1 volume percent, can optionally be added to further assist with defect reduction. Desirable organic additives for the developers can generally be identified through their Hansen solubility parameters and/or through their functional groups.

To produce commercially desirable patterning results, it is generally desirable for the patterned materials to be well defined and of high fidelity in order to enable specific functionality, for example conductivity or capacitance, of the integrated device. Defects, such as holes or breaks within patterns, can be deleterious to device functionality and can reduce overall device yield. It is thus desirable for the photoresist pattern after development to be of high fidelity and largely free of defects, such as undesired bridging between adjacent features, in order for the patterned structure to be successfully integrated into a device or circuit. Therefore, there is a demand for development methods and compositions that result in high fidelity patterns, i.e. with low defect rates. It has been discovered that the presence of certain additive compositions can improve patterning performance, particularly in terms of mitigating patterned defects such as microbridges or scum between features. Line width roughness (LWR) can also be improved, as shown in the examples below.

The new class of radiation based resists can be based on metal oxide chemistry (metal oxo/hydroxo compositions) using radiation sensitive ligands to control stability and processability of the resists. In general, these resist compositions function as negative tone photoresists when developed with organic solvents. Generally, patterning of these metal based compositions can benefit from the developers described herein. Related resist compounds are discussed in U.S. Pat. No. 8,703,386B2 to Bass et al., entitled "Metal Peroxo Compounds With Organic Co-ligands for Electron Beam, Deep UV and Extreme UV Photoresist Applications," incorporated herein by reference. Tin compositions are exemplified in herein, and while the data presented herein focuses on tin-based resists, the developer compositions described herein are expected to be effective for other metal based resists described below.

Organometallic photoresists such as organotin oxide hydroxides have been shown to possess excellent properties as photoresists for use in lithographic photopatterning. Suitable organometallic photoresists include organotin materials as described in U.S. Pat. No. 9,310,684B2 to Meyers et al., entitled "Organometallic Solution Based High Resolution Patterning Compositions," published U.S. patent application 2016/0116839A1 to Meyers et al., entitled "Organometallic Solution Based High Resolution Patterning Compositions and Corresponding Methods," and U.S. Pat. No. 10,228,618B2 entitled "Organotin Oxide Hydroxide Patterning Compositions, Precursors, and Patterning", all of which are incorporated herein by reference. Other organometallic patterning compositions based on various metals are described in published U.S. patent application 2002/0076495 to Maloney et al., entitled "Method of Making Electronic Material," and U.S. Pat. No. 9,372,402B2 to Freedman et al., entitled "Molecular Organometallic Resists for EUV," both of which are incorporated herein by reference. Resists with metal oxide particles having organic coatings are described in published U.S. patent application 2015/0234272A1 to Sarma et al., entitled "Metal Oxide Nanoparticles and Photoresist Compositions," incorporated herein by reference. Applicant has developed organotin patterning materials that have been progressed to a high degree, and some of these are the exemplified compositions.

Suitable organotin materials are generally based on the chemistry of radiation sensitive patterning compositions represented by the formula $R_zSnO_{(2-(z/2)-(x/2))}(OH)_x$ where $0<z\le2$ and $0<(z+x)\le4$, in which R is a hydrocarbyl group with 1-31 carbon atoms or blends thereof with distinct R groups, which can be written as $R_N$, for N distinct compositions. In a coating layer, the compositions can be integrated into a common oxo/hydroxo network. In particular, branched alkyl ligands can be desirable for some patterning compositions where the compound can be represented as $R^1R^2R^3CSn(NR')_3$, where $R^1$ and $R^2$ are independently an alkyl group with 1-10 carbon atoms, and $R^3$ is hydrogen or an alkyl group with 1-10 carbon atoms. As noted below, this representation of alkyl ligand R is similarly applicable to the other embodiments generally with $R^1R^2R^3CSn(X)_3$, with X corresponding to the trialkoxide or triamide moieties. In some embodiments $R^1$ and $R^2$ can form a cyclic alkyl moiety, and $R^3$ may also join the other groups in a cyclic moiety. Suitable branched alkyl ligands can be, for example, isopropyl ($R^1$ and $R^2$ are methyl and $R^3$ is hydrogen), tert-butyl ($R^1$, $R^2$ and $R^3$ are methyl), tert-amyl ($R^1$ and $R^2$ are methyl and $R^3$ is —$CH_2CH_3$), sec-butyl ($R^1$ is methyl, $R^2$ is —$CH_2CH_3$, and $R^3$ is hydrogen), neopentyl ($R^1$ and $R^2$ are hydrogen, and $R^3$ is —$C(CH_3)_3$), cyclohexyl, cyclopentyl, cyclobutyl, and cyclopropyl. Examples of suitable cyclic groups include, for example, 1-adamantyl (—$C(CH_2)_3$ $(CH)_3(CH_2)_3$ or tricyclo(3.3.1.13,7) decane bonded to the metal at a tertiary carbon) and 2-adamantyl (—$CH(CH)_2$ $(CH_2)_4(CH)_2(CH_2)$ or tricyclo(3.3.1.13,7) decane bonded to the metal at a secondary carbon). In other embodiments hydrocarbyl groups may include aryl or alkenyl groups, for example, benzyl or allyl, or alkynyl groups. In other embodiments the hydrocarbyl ligand R may include any group consisting solely of C and H and containing 1-31 carbon atoms. In summary, some examples of suitable alkyl groups bonded to tin include, for example, linear or branched alkyl (i-Pr (($CH_3$)$_2$CH—), t-Bu (($CH_3$)$_3$C—), Me ($CH_3$—), n-Bu ($CH_3CH_2CH_2CH_2$—)), cyclo-alkyl (cyclo-propyl, cyclo-butyl, cyclo-pentyl), olefinic (alkenyl, aryl, allylic), or alkynyl groups, or combinations thereof. In further embodiments suitable R groups may include hydrocarbyl groups substituted with hetero-atom functional groups including cyano, thio, silyl, ether, keto, ester, or halogenated groups or combinations thereof.

Precursor compositions to the form organotin oxo/hydroxyl coating compositions that integrate into a common oxo/hydroxo network can comprise one or more soluble organotin oxo/hydroxo compounds, or corresponding compounds with hydrolyzable ligands that form oxo and/or hydroxo ligands upon hydrolysis. For precursor compositions with a plurality of compounds, the compounds can have distinct organic ligands with metal-carbon bonds and the same or distinct hyrolyzable ligands. Thus, precursor compositions to form the radiation sensitive coatings can comprise solutions of one or more compounds represented by $R_nSnX_{4-n}$ where n=1 or 2, in which R is a hydrocarbyl group with 1-31 carbon atoms, such as described above, and X is a ligand with a hydrolysable M-X bond, and mixtures thereof. Suitable hydrolysable ligands can include, for example, alkynides RC≡C, alkoxides RO$^-$, carboxylates RCOO$^-$, halides, dialkylamides or combinations thereof. In particular, organotin trialkoxide compositions can be represented by the formula $RSn(OR^O)_3$, where the $R^O$ group can be one of the same moieties described above for R. In some embodiments, the aforementioned organotin precursor compositions can further comprise compositions represented by $MX_4$ and/or $MO_{((m/2)-1/2)}(OH)_1$ where 0<z≤2, 0<(z+w)≤4, m=formal valence of $M^{m+}$, 0≤l≤m, and M=M' or Sn, where M' is a non-tin metal of groups 2-16 of the periodic table. In general, organotin photoresists exhibit both high resolution and high etch resistances that enable the formation of small features and patterns. In situ hydrolysis during the coating process or after a coating step can be used to hydrolyze the hydrolyzable M-X bonds to form an oxo/hydroxo network in the coating prior to patterning. The precursor compounds can also form clusters in solution with appropriate ligand rearrangement, in which at least some of the hydrolyzable ligands may be replaced with oxo bridges or hydroxyl groups, such as with three tin atoms, as described in published U.S. patent applications 2019/0053001 to Cardineau et al., entitled "Organotin Clusters, Solutions of organotin Clusters, and Application to High Resolution Patterning," and 2019/0308998 to Cardineau et al., entitled "Tin Dodecamers and Radiation Patternable Coatings With Strong EUV Absorption," both of which are incorporated herein by reference.

Formation of photosensitive organotin coatings can be achieved through various means known by those of ordinary skill in the art, such as spin coating. For solution deposition of precursors, for tin based resists described above, tin concentrations generally can be in the range of about 1 mM to about 1 M, in further embodiments from about 2 mM to about 750 mM, and in other embodiments from about 5 mM to about 500 mM by amount of tin. In some embodiments photosensitive organotin coatings can be formed via vapor deposition techniques, such as atomic layer deposition (ALD) or chemical vapor deposition (CVD) techniques, as described in Meyers et al. U.S. Pat. No. 10,228,618B2 entitled "Organotin Oxide Hydroxide Patterning Compositions, Precursors, and Patterning", and Smith et al. U.S. Pat. No. 9,996,004B2, entitled "EUV Photopatterning of Vapor-Deposited Metal Oxide-Containing Hardmasks", respectively, and both of which incorporated herein by reference.

The thickness of the coating generally can be a function of the precursor solution concentration, viscosity, and the spin speed. For other coating processes such as vapor deposition, the thickness can generally also be adjusted through the selection of the coating parameters. In some embodiments, it can be desirable to use a thin coating to facilitate formation of small and highly resolved features. In some embodiments, the coating materials can have an average dry thickness prior to development of no more than about 1 micron, in further embodiments no more than about 250 nanometers (nm), in additional embodiments from about 1 nanometers (nm) to about 50 nm, in other embodiments from about 1 nm to about 40 nm and in some embodiments from about 1 nm to about 25 nm. The ranges of post development coating thickness for the exposed regions generally fall within the same ranges as presented above with the realization that development may remove a relatively small amount of exposed material. A person of ordinary skill in the art will recognize that additional ranges of solution concentrations and thicknesses within the explicit ranges above are contemplated and are within the present disclosure. The thickness can be evaluated using non-contact methods of x-ray reflectivity and/or ellipsometry based on the optical properties of the film.

After deposition and formation of an organotin coating, an edge bead removal (EBR) rinse step generally is used. EBR processing typically occurs prior to any thermal processing or baking following deposition of the photoresist and involves rinsing the peripheral edge of a wafer or substrate with a solvent to remove the photoresist in selected regions. An EBR and backside rinse involves applying the edge bead rinse solution to the edge as well as the back of the wafer, as described in Waller et al. U.S. Pat. No. 10,627,719, entitled "Methods of Reducing Metal Residue in Edge Bead Region from Metal-Containing Resists", incorporated herein by reference.

A soft bake, or a post-apply bake (PAB) is typically performed prior to radiation exposure to hydrolyze the hydrolysable bonds in the precursor compositions, and/or further drive off solvent, and promote densification of the coating material. In some embodiments, the PAB can be performed at temperatures from about 25° C. to about 250° C., in additional embodiments from about 50° C. to about 200° C. and in further embodiments from about 80° C. to about 150° C. The post exposure heating can generally be performed for at least about 0.1 minute, in further embodiments from about 0.5 minutes to about 30 minutes and in additional embodiments from about 0.75 minutes to about 10 minutes. A person of ordinary skill in the art will recognize that additional ranges of PEB temperatures and times within the explicit ranges above are contemplated and are within the present disclosure. The coated material generally comprises a polymeric metal oxo-hydroxo network based on the binding oxo-hydroxo ligands to the metals in which the metals also have some alkyl ligands, or a molecular solid comprised of polynuclear metal oxo-hydroxo species with alkyl ligands.

Generally, organotin photoresist coatings can be patterned using radiation. Suitable radiation sources include extreme ultraviolet (EUV), ultraviolet (UV), or electron beam (EB) radiation. For fabrication of semiconductor devices, EUV radiation is generally preferable due to its higher resolution compared to UV radiation, and its higher throughput compared to EB-based processing. Radiation can generally be directed to the substrate material through a mask or a radiation beam can be controllably scanned across the substrate to form a latent image within the resist coating.

Following International Standard ISO 21348 (2007) incorporated herein by reference, ultraviolet light extends between wavelengths of greater than or equal 100 nm and less than 400 nm. A krypton fluoride laser can be used as a source for 248 nm ultraviolet light. The ultraviolet range can be subdivided in several ways under accepted Standards, such as extreme ultraviolet (EUV) from greater than or equal 10 nm to less than 121 nm and far ultraviolet (FUV) from greater than or equal to 122 nm to less than 200 nm. A 193 nm line from an argon fluoride laser can be used as a radiation source in the FUV. EUV light has been used for lithography at 13.5 nm, and this light is generated from a Xe or Sn plasma source excited using high energy lasers or discharge pulses. Commercial sources of EUV photons include scanners fabricated by ASML Holding N.V. Netherlands. Soft x-rays can be defined from greater than or equal 0.1 nm to less than 10 nm. The light is directed through a mask to form a latent image in the radiation sensitive coating with exposed regions and un-exposed regions.

The amount of electromagnetic radiation can be characterized by a fluence or dose which is obtained by the integrated radiative flux over the exposure time. In some embodiments, suitable radiation fluences can be from about 1 mJ/cm$^2$ to about 200 mJ/cm$^2$, in further embodiments from about 2 mJ/cm$^2$ to about 150 mJ/cm$^2$ and in further embodiments from about 3 mJ/cm$^2$ to about 100 mJ/cm$^2$. In an embodiment, the EUV radiation can be done at a dose of less than or equal to about 150 mJ/cm$^2$ or with an electron beam at a dose equivalent to or not exceeding about 2 mC/cm$^2$ at 30 kV. A person of ordinary skill in the art will recognize that additional ranges of radiation fluences within the explicit ranges above are contemplated and are within the present disclosure.

With electron beam lithography, the electron beam generally induces secondary electrons which generally modify the irradiated material. The resolution can be a function at least in part of the range of the secondary electrons in the material in which a higher resolution is generally believed to result from a shorter range of the secondary electrons. Based on high resolution achievable with electron lithography using the organometallic coating materials described herein, the range of the secondary electrons in the organometallic material is limited. Electron beams can be characterized by the energy of the beam, and suitable energies can range from about 5 eV to about 200 keV and in further embodiments from about 7.5 eV to about 100 keV. Proximity-corrected beam doses at 30 keV can range from about 0.1 microcoulombs per centimeter squared (μC/cm$^2$) to about 5 millicoulombs per centimeter squared (mC/cm$^2$), in further embodiments from about 0.5 μC/cm$^2$ to about 1 mC/cm$^2$ and in other embodiments from about 1 μC/cm$^2$ to about 100 μC/cm$^2$. A person of ordinary skill in the art can compute corresponding doses at other beam energies based on the teachings herein and will recognize that additional ranges of electron beam properties within the explicit ranges above are contemplated and are within the present disclosure.

Following exposure to radiation and the formation of a latent image, a subsequent post-exposure bake (PEB) is typically performed. In some embodiments, the PEB can be performed at temperatures from about 45° C. to about 250° C., in additional embodiments from about 50° C. to about 190° C. and in further embodiments from about 60° C. to about 175° C. The post exposure heating can generally be performed for at least about 0.1 minute, in further embodiments from about 0.5 minutes to about 30 minutes and in additional embodiments from about 0.75 minutes to about 10 minutes. A person of ordinary skill in the art will recognize that additional ranges of PEB temperatures and times within the explicit ranges above are contemplated and are within the present disclosure. The PEB can be designed to further consolidate the exposed regions without decomposing the un-exposed regions into a metal oxide.

Owing to their compositions comprising both metal oxide and organic ligands, it has been shown that both positive tone and negative tone patterning can be achieved in an organotin oxide hydroxide system. For example, when an organic solvent is used as a developer then negative tone patterning is realized wherein the unexposed material is dissolved away and the exposed material remains. In contrast, when an aqueous acid or base solution, for example comprising tetraalkyl ammonium hydroxide, is used as a developer then positive tone patterning can be realized wherein the exposed material is dissolved away and the unexposed material remains. The improved developers described herein are directed to negative tone image formation.

For negative tone imaging, the developer can comprise an organic solvent, such as the solvents used to form the precursor solutions. To form an improved developer, additives can be added to a base organic solvent. The additives can be other organic solvents, and properties of the developer components are described to allow for identification and distinguishing of the different components. It has been discovered that effective additives comprise compositions with certain values of Hansen Solubility Parameters (HSPs), which were developed to characterize solvent properties. Hansen solubility parameters include δD (dispersion), δP (polarity), δH (hydrogen bonding) and δT (total, where $(\delta T)^2 = (\delta D)^2 + (\delta P)^2 + (\delta H^2)$). With respect to notation for Hansen solubility parameters, the literature uses either "δ" or "d" interchangeably, and the provisional priority application used the "d" convention. Values Hansen Solubility Parameters were first presented in the 1967 Ph.D. thesis of Charles M. Hansen, and have since been discussed extensively in the technical literature. Generally, Hansen Solubility Parameters for a composition are determined empirically, and the values presented herein are from the Knovel Solvents—A Property Database ((2008, 2012) Author(s)/Editor(s): Wypych, George, Publisher: ChemTec Publishing Copyright Date2008; 2012; 2019ISBNN/AElectronic ISBN978-1-59124-533-9), incorporated herein by reference.

While not wanting to be limited by theory, it is believed that compositions with higher δH and/or δP parameters, relative to 2-heptanone solvent or the like, are able to better solubilize partially hydrolyzed and/or condensed material that is suspected to comprise certain patterned defects, such as microbridges and/or scum between features. As described in the following, the basic solvent selection can be generalized around 2-heptone, and additives can be more effectively identified by relatively large values of the sum of δH and δP. The enhanced effect of developers with composition blends may also be due to a chemical interaction, i.e. complexation and/or coordination, of at least part of the developer or rinse composition with organotin material. In general, it is anticipated that developer compositions with δH and δP parameters higher than 2-heptanone can achieve improved results, i.e. lower defect densities. The selection of a solvent blend allows for control of the strength of the developer to produce desired features at a reasonable dose. The base solvents can be selected to effectively dissolve the unexposed patterning composition. The additive solvent can increase the developer strength to help dissolve partially exposed or partially condensed patterning compositions that may exist along edges of the pattern or at random locations in the pattern such that sharper edges (i.e, edges having lower edge roughness) can be obtained.

In general, selection of appropriate developer solvent compositions can be influenced by solubility parameters with respect to the coating material, both irradiated and non-irradiated, as well as developer volatility, flammability, toxicity, viscosity, and potential chemical interactions with other process material. In particular, suitable base solvents for the developer include, for example, aromatic compounds (e.g., benzene, xylenes, toluene), esters (e.g., propylene glycol monomethyl ether acetate, ethyl acetate, ethyl lactate, n-butyl acetate, butyrolactone), ketones (e.g., methyl ethyl ketone, acetone, 2-butanone, cyclohexanone, 2-heptanone, 2-octanone), ethers (e.g., tetrahydrofuran, dioxane, anisole), 4-methyl-2-pentanol (and other weakly polar alcohols), blends thereof, and the like. In general, the base solvents have a sum of Hansen solubility parameter $\delta H + \delta P$ of no more than about 16.0 $(J/cm^3)^{1/2}$. Also, the suitable solvents are generally identified in the chemical genera identified above with the caveat that all members of these groups may have the identified solubility properties, especially if they include a plurality of functional groups. In some contexts, the solvent blend can conveniently be characterized with the chemical species and their functional groups without reference to the solubility parameters.

For embodiments with a blend of solvents, the developer generally comprises at least about 55 volume percent base solvent, in further embodiments from about 60 vol % to about 99.75 vol %, in additional embodiments from about 65 vol % to about 99.5 vol %, in additional embodiments from about 70 vol % to about 99.25 vol %, and in other embodiments form about 75 vol % to about 99 vol % base solvent, which can involve one or more solvent compounds with the selected solubility parameters. A person of ordinary skill in the art will recognize that additional ranges of base solvent concentrations within the explicit ranges above are contemplated and are within the present disclosure. Volume percent values are calculated based on the solvent volumes prior to blending. Volume percent values can be converted to weight percent values according to the densities, if desired.

As described herein, one or more highly polar additional solvent, referred to as a polar solvent, can be added to the solvent blend to form improved developers. In some embodiments, the developer can have from 0.25 vol % to about 45 vol % polar solvent, in further embodiments from about 0.4 vol % to about 30 vol %, in additional embodiments from about 0.5 vol % to about 25 vol %, and in other embodiments form about 0.75 vol % to about 22 vol % polar solvent. In some embodiments, the polar solvent can have a sum of Hansen solubility parameter $\delta H + \delta P$ of at least about 16.0 $(J/cm^3)^{1/2}$. Suitable polar solvents include, for example, water, acetone, polar monohydroxyl alcohols (such as methanol, ethanol, propanol, isobutanol, pentanol, and mixtures thereof), polyhydroxyl compounds (such as ethylene glycol, propylene glycol, glycerol), pyrrolidones (such as 2-pyrrolidone, 1-ethyl-2-pyrrolidone, N-methyl-2-pyrrolidone), glycol ethers (such as ethylene glycol monomethyl ether), carboxylic acids (such as formic acid, acetic acid oxalic acid, 2-ethylhexanoic acid), diols (e.g., 1,2-hexanediol, 1,2-propanediol, 1,3-propanediol), and mixtures thereof. A person of ordinary skill in the art will recognize that additional ranges of polar solvent concentrations within the explicit ranges above are contemplated and are within the present disclosure.

Water may be present in the initial solvents, and this inherent water should be taken into account in the evaluation of water content. For convenience to distinguish developers with a potentially significant contribution from water, developers can be categorized as having at least 0.1 wt % (1000 ppm) or less than 0.1 wt % (1000 ppm) water, which herein can for convenience be referred to, respectively, as having water or as being water free or effectively water free. For water, a weight percent can be converted to a volume percent according to the densities to allow the calculation of a volume percent water consistent with the general discussion herein. Unless indicated otherwise, herein ppm represent parts per million by mass. In some embodiments, water is used as an additive alone in a base solvent in small quantities. Thus, in these embodiments, the developer has at least about 2000 ppm water, in further embodiments from about 2500 ppm to about 10 wt %, in some embodiments from about 3500 ppm to about 5 wt %, and in other embodiments from about 4000 ppm to about 3 wt % water. A person of ordinary skill in the art will recognize that additional composition ranges within the explicit ranges above are contemplated and are within the present disclosure.

In addition to the primary developer solvent compositions, the developer can comprise additional compositions to facilitate the development process. Suitable additives include, for example, dissolved salts with cations selected from the group consisting of ammonium, d-block metal cations (hafnium, zirconium, lanthanum, or the like), f-block metal cations (cerium, lutetium or the like), p-block metal cations (aluminum, tin, or the like), alkali metals (lithium, sodium, potassium or the like), and combinations thereof, and with anions selected from the group consisting of fluoride, chloride, bromide, iodide, nitrate, sulfate, phosphate, silicate, borate, peroxide, butoxide, formate, ethylenediamine-tetraacetic acid (EDTA), tungstate, molybdate, or the like and combinations thereof. A surfactant can be added to lower surface tension to facilitate application of the developer. Suitable surfactants can include, for example, ionic surfactants (such as alkyl ether sulfates, benzyl sulfonates, and phosphate esters, and the like) and non-ionic surfactants (such as ethoxylated and alkoxylated fatty acids, ethoxylated amines, ethoxylated alcohol, alkyl and nonylphenol ethoxylates, and the like). Other suitable optional additives include, for example, phase transfer agents (such as tetraalkyl ammonium salts, polyethylene glycols, and crown ethers). If the optional additives are present, the developer can comprise no more than about 5 weight percent additive, in further embodiments no more than about 2.5 weight percent additive, and in additional embodiments no more than about 1 weight percent additive. A person of ordinary skill in the art will recognize that additional ranges of additive concentrations within the explicit ranges above are contemplated and are within the present disclosure. The additives can be selected to improve contrast, sensitivity and line width roughness. The additives in the developer can also inhibit formation and precipitation of metal oxide particles.

The developer can be applied to the patterned coating material using any reasonable approach. For example, the developer can be sprayed onto the patterned coating material, or the structure can be dipped or otherwise immersed in the developer. Also, spin coating can be used. For automated processing, a puddle method can be used involving the pouring of the developer onto the coating material in a stationary format. If desired spin rinsing and/or drying can be used to complete the development process. After the image is developed, the coating material is disposed on the substrate as a pattern.

Development can be performed using any reasonable process approach, such as spray coating, puddle dipping and the like. For commercial production, development generally is adapted for the process equipment provided. The development can be performed for about 2 seconds to about 30 minutes, in further embodiments from about 3 seconds to about 15 minutes, in other embodiments from about 4 seconds to about 10 minutes, and in additional embodiments from about 5 seconds to about 5 minutes. A person of ordinary skill in the art will recognize that additional ranges within the explicit ranges above are contemplated and are within the present disclosure.

Based on the design of the coating material, there can be a large contrast of material properties between the irradiated regions that have condensed coating material and the un-irradiated regions of the coating material with substantially intact photosensitive ligands, such as organic and/or carboxylate ligands. This high contrast in material properties further facilitates the formation of high-resolution lines with smooth edges in the pattern following development as described in the examples.

After completion of the development step including any optional rinses, the coating materials can be heat treated to further condense the material and to further dehydrate, densify, or remove residual developer from the material. This heat treatment can be particularly desirable for embodiments in which the oxide coating material is incorporated into the ultimate device, although it may be desirable to perform the heat treatment for some embodiments in which the coating material is used as a resist and ultimately removed if the stabilization of the coating material is desirable to facilitate further patterning. In particular, the bake of the patterned coating material can be performed under conditions in which the patterned coating material exhibits desired levels of etch selectivity. In some embodiments, the patterned coating material can be heated to a temperature from about 100° C. to about 600° C., in further embodiments from about 175° C. to about 500° C. and in additional embodiments from about 200° C. to about 400° C. The heating can be performed for at least about 1 minute, in other embodiment for about 2 minutes to about 1 hour, in further embodiments from about 2.5 minutes to about 25 minutes. The heating may be performed in air, vacuum, or an inert gas ambient, such as Ar or $N_2$. A person of ordinary skill in the art will recognize that additional ranges of temperatures and time for the heat treatment within the explicit ranges above are contemplated and are within the present disclosure. Likewise, non-thermal treatments, including blanket UV exposure, or exposure to an oxidizing plasma such as $O_2$ may also be employed for similar purposes.

In some embodiments, adjacent linear segments of neighboring structures can have an average pitch (half-pitch) of no more than about 60 nm (30 nm half-pitch), in some embodiments no more than about 50 nm (25 nm half-pitch) and in further embodiments no more than about 34 nm (17 nm half-pitch). Pitch can be evaluated by design and confirmed with scanning electron microscopy (SEM), such as with a top-down image. As used herein, pitch refers to the spatial period, or the center-to-center distances of repeating structural elements, and as generally used in the art a half-pitch is a half of the pitch. Feature dimensions of a pattern can also be described with respect to the average width of the feature, which is generally evaluated away from corners or the like. Also, features can refer to gaps between material elements and/or to material elements. In some embodiments, average widths can be no more than about 25 nm, in further embodiments no more than about 20 nm, and in additional embodiments no more than about 15 nm. A person of ordinary skill in the art will recognize that additional ranges of pitch and average widths within the explicit ranges above are contemplated and are within the present disclosure. Based on these processes, the patterning can be adapted to the formation of various devices such as electronic integrated circuits, generally through the repeated patterning process to form appropriately layered structures, such as transistors or other components.

Wafer throughput is a substantially limiting factor for implementation of EUV lithography in high-volume semiconductor manufacturing, and is directly related to the dose required to pattern a given feature. However, while chemical strategies exist to reduce imaging dose, a negative correlation between the imaging dose required to print a target feature, and feature size uniformity (such as LWR) is commonly observed for EUV photoresists at feature sizes and pitches <50 nm, thereby limiting final device operability and wafer yields. Photoresist sensitivity can be expressed in terms of the dose-to-gel value, and imaging dose requirements can be evaluated by forming an array of exposed pads in which the exposure time is stepped from pad to pad to change the dosing of the exposure. The film can then be developed, and the thickness of the remaining resist can be evaluated for all of the pads, for example, using spectroscopic ellipsometry. The measured thicknesses can be normalized to the maximum measured resist thickness and plotted versus the logarithm of exposure dose to form characteristic curves. The maximum slope of the normalized thickness vs log dose curve is defined as the photoresist contrast ($\gamma$) and the dose value at which a tangent line drawn through this point equals 1 is defined as the photoresist dose-to-gel, ($D_g$). In this way common parameters used for photoresist characterization may be approximated following Mack, C. *Fundamental Principles of Optical Lithography*, John Wiley & Sons, Chichester, U.K; pp 271-272, 2007.

In some embodiments, average line-width roughness can be no more than about 5.5 nm, in some embodiments no more than about 5 nm and in further embodiments no more than about 4.5 nm. As shown in the Examples, the line width roughness can be evaluated as a function of a critical dimension. Evaluating line-width roughness is performed by analysis of top-down SEM images to derive a 3σ deviation from the mean line-width. The mean contains both high-frequency and low-frequency roughness, i.e., short correlation lengths and long correlation lengths, respectively. The line-width roughness of organic resists is characterized primarily by long correlation lengths, while the present organometallic coating materials exhibit significantly shorter correlation lengths. In a pattern transfer process, short correlation roughness can be smoothed during the etching process, producing a much higher fidelity pattern. A person of ordinary skill in the art will recognize that additional ranges of line-width roughness within the explicit ranges above are contemplated and are within the present disclosure. Based on these processes, the patterning can be adapted to the formation of various devices such as electronic integrated circuits, generally through the repeated patterning process to form appropriately layered structures, such as transistors or other components.

In some embodiments it may be beneficial to perform an additional rinse process immediately following the development process. The rinse process may generally comprise contacting the developed material with an additional composition comprising a solvent or a solvent and an additive. As shown in the examples, a rinse step with solvent alone tends to result in greater numbers of defects. A rinse step though with the improved development compositions described above with an additive can result in a decrease of defects and/or greater uniformity of process results. In some embodiments, the rinse composition can be one of the same compositions as described above for developers. For example, the rinse composition can comprise a solvent chosen from a ketone, an ester, an ether, or a mixture thereof, and the additive can comprise a carboxylic acid, a monohydroxyl alcohol, a polyol, such as a diol, a pyrrolidone, a lactone, or mixtures thereof. Specifically, for example, the rinse composition can comprise a mixture of 2-heptanone and 1,2-hexanediol. In general, the rinse process can be similar to the development process except that the development step results in significant coating removal, while the rinse step generally does not involve a large removal of material. The rinse process can be performed for about 1 seconds to about 20 minutes, in further embodiments from about 2 seconds to about 12 minutes and in additional embodiments from about 4 seconds to about 6 minutes. A person of ordinary skill in the art will recognize that additional ranges within the explicit ranges above are contemplated and are within the present disclosure.

An alternative rinse approach was described by the Applicant in U.S. patent application Ser. No. 16/654,080 to Kocsis et al., entitled "Patterned Organometallic Photoresists and Methods of Patterning," incorporated herein by reference. Rinsing in the '080 application was based on an aqueous rinse agent, which tended to dissolve to some degree the exposed portion of the pattern, although the rinse process was controlled to limit this dissolving of the exposed portion of the pattern. This rinsing was effective to remove defects, and it also changed pattern dimensions. Such processing can be considered to be alternatives to the present improved development processing. In the rinsing described in the Examples, a rinse step using a base solvent alone generally resulted in an increase in defects. A rinse using the improved developer liquids resulted in some additional reduction of defects.

The present processing approaches are designed to reduce or eliminate defects, such as microbridging defects as well as larger defects. For uniformity of data comparison, bridging defects, particle defects, and large cluster defects are not considered in the evaluation of microbridge defects. Bridging differs from microbridging in that bridging can be determined by a critical pixel count in the y direction—if it is over a size threshold it is considered a bridge, and excluded. In most, but not all, cases manual review of these images suggests a different mechanism such as a fall-on type particle. These are a relatively small contribution to overall defect counts (<10% for high defect samples like control wafers) relative to microbridge counts. An automated process is used in the evaluation of the microdefects as explained in the Examples below. Basically, a series of critical dimension scanning electron micrographs are taken. The CD-SEM images are analyzed using analytical software to count the number of microbridges. Examples of microbridges are shown in SEM micrographs in FIG. 1.

To help evaluate the development, wafers were patterned to evaluate pattern formation as a function of EUV dose. To first order, imaging is considered a step function of regions of illumination and non-illuminated regions. For patterning of very fine features, such as lines and spaces, and pushing development to achieve low feature roughness, the actual feature widths and pitch for a particular dose are evaluated to determine an $E_{size}$, which can be defined as the dose producing a target feature width with a mask designed to achieve the feature width using a selected developer. A stronger developer may etch more along an edge for a particular illumination dose and a weaker developer correspondingly less etching along an edge such that the developed line width depends on the developer. Wafers were exposed across a range of EUV doses to produce a grid of fields of nominally identical features, but each having been illuminated with a different EUV dose as to yield correspondingly different feature size. The dose that achieves the target line width is called the $E_{size}$, which then correspondingly has units of a dose (mJ/cm$^2$). Values of $E_{size}$ are presented in the examples to evaluate performance of developers at specified process conditions.

In general, it is desirable to lower the EUV doses to improve throughput through the EUV scanning components since illumination times can depend on the dose. However, the tradeoffs between patterning dose and feature roughness and/or ultimate resolution are well known such that the quality of the pattern generally improves with increasing dose. As seen in the Examples below, the developers, process conditions, and related methods described herein can enable larger process windows, i.e. a range of doses with sufficiently low LWR and/or low defectivity, than conventional ketone developers. Furthermore, the current invention allows one to choose specific process conditions and developer compositions to reduce LWR and/or patterned defectivity without a concomitant increase in dose. The patterning compositions themselves have been engineered to have lower dose requirements. Therefore, the design of improved patterning compositions and methods, such as those used herein, allow for excellent pattern quality with reasonable dose values.

After patterning, the patterned material can be used for further processing such as deposition of material into gaps in the patterned material, and/or etching to remove substrate material between gaps in the patterned material. Then, the patterned resist material can be removed following further processing with a suitable etchant composition, such as a dilute base or BCl$_3$ plasma. The processing is frequently repeated to form stacks of patterned layers to form functional components.

In the following Examples, data is presented that demonstrates improved performance of the present invention compositions. A representative organotin photoresist composition as described in Meyers et al. U.S. Pat. No. 10,228,618B2, incorporated herein by reference, was used to investigate the efficacy of the compositions in the present disclosure. Performance of the present invention was shown to be improved over a standard ketone solvent developer composition. The newly discovered developer solutions enable the formation of patterns and structures with improved patterned defect densities, particularly microbridging defects, at equivalent dimensions.

EXAMPLES

Example 1. Patterning with Various Developer Compositions

This example presents dose-to-gel values obtained by exposing organotin oxide hydroxide photoresists to EUV radiation and developing in organic solvents with different Hansen Solubility Parameters.

Tert-butyltin oxide hydroxide photoresist films were deposited from a precursor coating solution prepared by combining separately prepared solutions of $^t$BuSn(NEt$_2$)$_3$ and Sn(NMe$_2$)$_4$ in dry 4-methyl-2-pentanol to achieve a final solution comprising a mixture of 0.04 M $^t$BuSn(NEt$_2$)$_3$ and 0.01 M Sn(NMe$_2$)$_4$ as described in Example 4 of the '618 patent cited above. Thin films for EUV contrast curves were deposited on silicon wafers (100-mm diameter) with a native-oxide surface. The Si wafers were treated with a hexamethyldisilazane (HMDS) vapor prime prior to deposition. Precursor coating solutions were spin-coated on the Si substrates in air at 1000 rpm and baked on a hotplate in air for 2 min at 100° C. to eliminate residual solvent and volatile hydrolysis products. Film thicknesses following coating and baking were measured via ellipsometry to be ~25 nm.

A linear array of 50 circular pads ~500 μm in diameter were exposed on each wafer with EUV light using the Lawrence Berkeley National Laboratory Micro Exposure Tool. Pad exposure times were modulated to step the delivered EUV dose for each pad from 0.63 to 27.39 mJ cm-2 with an exponential 8% step. After exposure, wafers were subjected to a post-exposure bake (PEB) on a hotplate in air at 160° C. for 2 min. The exposed films were then in dipped one of the developer solvents listed in Table 1 for 30 seconds to form a negative tone image, i.e., unexposed portions of the coating were removed. Films were removed from the developer solvent and blown dry with a nitrogen gun. A final 5-min hotplate bake at 150° C. in air was performed after development. A J. A. Woollam M-2000 spectroscopic ellipsometer was used to measure the residual thickness of the exposed pads. The measured thickness for each pad was then normalized to the maximum measured resist thickness and plotted versus the logarithm of exposure dose to form characteristic curves for each developer solvent. The maximum slope of the normalized thickness vs log dose curve is defined as the photoresist contrast (γ), and occurs at dose value $D_1$. The photoresist dose-to-gel, ($D_g$) is defined as the dose at which a tangent line drawn through $D_1$ with slope γ equals 1. In this way common parameters used for photoresist characterization may be approximated following Mack, C. *Fundamental Principles of Optical Lithography*, John Wiley & Sons, Chichester, U.K; pp 271-272, 2007.

Figure 2:
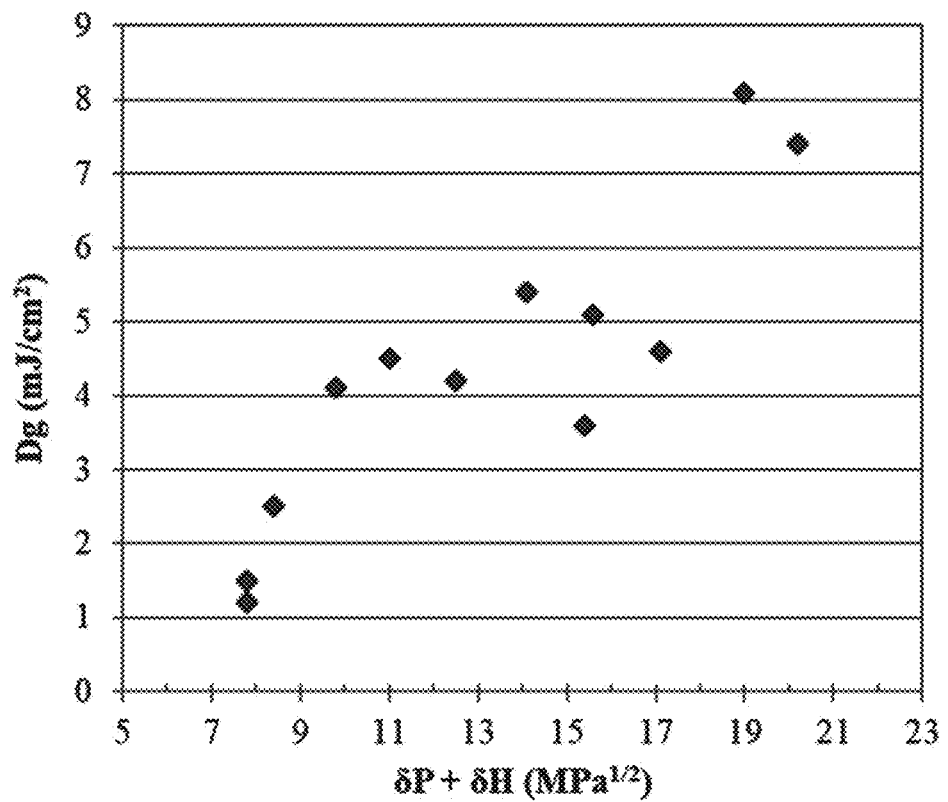
FIG. 2 is a plot of dose to gel ($D_g$) versus the sum of Hansen Solubility Parameters $\delta H$ and $\delta P$ for the solvents in Table 1 with $D_g$ the measured EUV dose to gel when each solvent is used as a developer for an organotin oxide hydroxide photoresist processed with a 160° C. post-exposure bake (PEB) temperature.

A practical interpretation of $D_g$ is the dose required to achieve the maximal development rate change relative to the unexposed material. $D_g$ values for identical organotin oxide hydroxide photoresist films developed in each solvent from Table 1 are plotted in FIG. 2 versus a total polarity term for each solvent defined as the sum of Hansen δP and δH parameters. Hansen Solubility Parameters are taken from Wypych, G. *Knovel Solvent Database*, ChemTec Publishing, 2008, 2012. A clear positive correlation between $D_g$ and the total polarity term is observed—thus higher polarity developer solvents are found to be generally stronger developers and access a higher $D_g$ for a fixed resist and process.

TABLE 1

| Developer Solvent | δD (MPa$^{1/2}$) | δP (MPa$^{1/2}$) | δH (MPa$^{1/2}$) | Dg (mJ/cm$^2$) |
|---|---|---|---|---|
| 1-ethyl-2-pyrrolidone | 18 | 12 | 7 | 8.1 |
| 2-butanone | 16 | 9 | 5.1 | 5.4 |
| 2-heptanone | 16.2 | 5.7 | 4.1 | 4.1 |
| diisobutyl ketone | 16 | 3.7 | 4.1 | 1.5 |
| 2-butanol | 15.8 | 5.7 | 14.5 | 7.4 |
| 2-heptanol | 15.7 | 5.4 | 11.7 | 4.6 |
| 4-methyl-2-pentanol | 15.4 | 3.3 | 12.3 | 5.1 |
| ethyl acetate | 15.8 | 5.3 | 7.2 | 4.6 |
| cyclohexyl acetate | 16.9 | 2.8 | 5.6 | 4.8 |
| dibutyl oxalate | 16.2 | 4.4 | 6.6 | 7.7 |
| methyl laurate | 16.1 | 3.6 | 4.2 | 1.5 |
| PGMEA | 15.6 | 5.6 | 9.8 | 3.1 |

Example 2: Preparation of Organotin Coated Resists and Evaluation of Patterning Performance In this example, developer compositions are described in the context of organotin oxide hydroxide photoresist films comprising a mixture of $^t$BuSnO$_{(3/2-(x/2))}$(OH)$_x$ and MeSnO$_{(3/2-(x/2))}$(OH)$_x$ prepared via in situ hydrolysis of a precursor solution comprising $^t$BuSnX$_3$ and MeSnX$_3$ compounds and evaluation of these films is described generally to provide a context for the results in the following examples.

Photoresist precursor coating solutions were prepared using a method similar to that described in published U.S. patent application 2019/0391486 to Jiang et al. A mixture comprising 20 mol % MeSn(O$^t$Amyl)$_3$ and 80 mol % $^t$BuSn(O$^t$Amyl)$_3$ (where O$^t$Amyl=2-methylbutan-2-oxide) was prepared under an inert atmosphere and subsequently dissolved in 4-methyl-2-pentanol in which the H$_2$O concentration had been pre-adjusted to ~300 ppm. The final Sn concentration of the precursor coating solution was 0.05 M.

Figure 3:
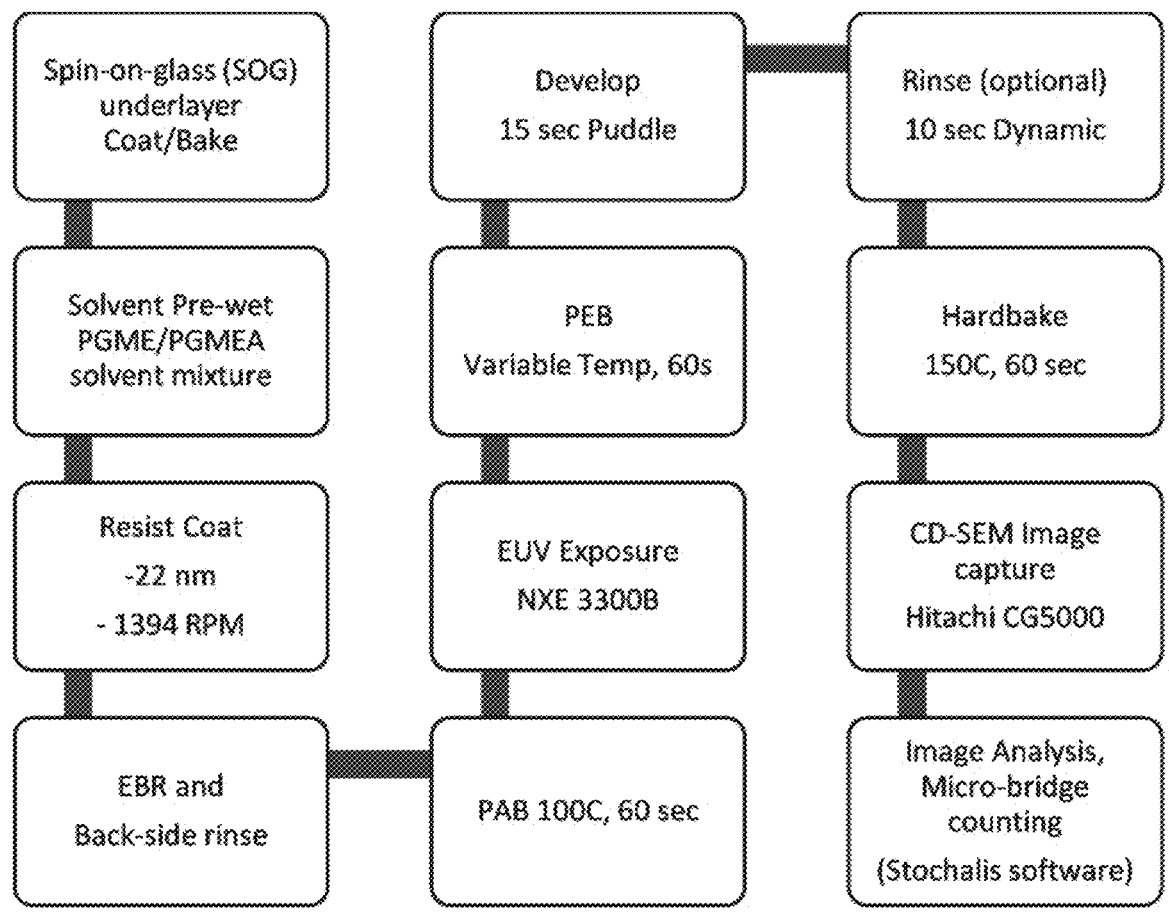
FIG. 3 is a flow chart for a photolithographic process according to embodiments of the present disclosure.

A flow diagram of procedure for analyzing wafer patterning for defects is shown in FIG. 3. The precursor solutions described above were used to coat organotin oxide hydroxide photoresist films using a TEL CLEAN TRACK LITHIUS Pro Z coater/developer. Silicon wafers (300-mm diameter) were coated with a 10 nm spin-on-glass (SOG) underlayer (ISX328, JSR) and baked in air at 220° C. for 1 minute prior to photoresist coating. A solvent pre-wet step using a PGME/PGMEA mixture was used to improve photoresist coat uniformity. Resist precursor coating solutions were then spin-coated on underlayer-coated substrates in air at 1394 rpm. After an edge-bead rinse (EBR) and back-side rinse, the coated wafers were subjected to a post-apply bake (PAB) on a hotplate in air for 1 min at 100° C. Edge-bead-rinsing is described generally in published U.S. patent application 2018/0046086 to Waller et al., entitled "Methods of Reducing Metal Residue in Edge Bead Region From Metal-Containing Resists," incorporated herein by reference.

Following PAB, resist-coated substrates were exposed to extreme ultraviolet radiation using an ASML NXE:3300B scanner at a numerical aperture of 0.33 with dipole 90× illumination. A pattern of equal vertical 16-nm lines and spaces (16p32) was projected on the coated wafer at a fixed focus, and the wafer stepped after each exposure to create an approximately annular array of fields about the center of the wafer with varied exposure doses. The exposed resist films and substrates were then returned to the coater/developer track and subjected to a hotplate PEB for 1 min in air at a specified temperature. Following PEB, the exposed films were then developed using set puddle development recipe with the selected developer composition for 15 seconds, then dynamically rinsed an additional 10 seconds with a rinse solution to form a negative tone image, i.e., unexposed portions of the coating were removed. A final 1-min hotplate bake at 150° C. in air was performed after development.

A Hitachi CG5000 CD-SEM was used to measure the average line width (critical dimension, CD) and 3-sigma line-width roughness (LWR) for each field along the scanned dosage range. From these data a fit of the CD-Dose curve was used to calculate dose to size ($E_{size}$, i.e. the dose required to print a line CD equal to one-half the pitch) and 4 fields spanning a target CD chosen for microbridge defect analysis.

Microbridge defect analysis was performed by collecting 150 CD-SEM images from the same unique locations within each of the 4 selected line-space fields on each wafer.

Figure 13:
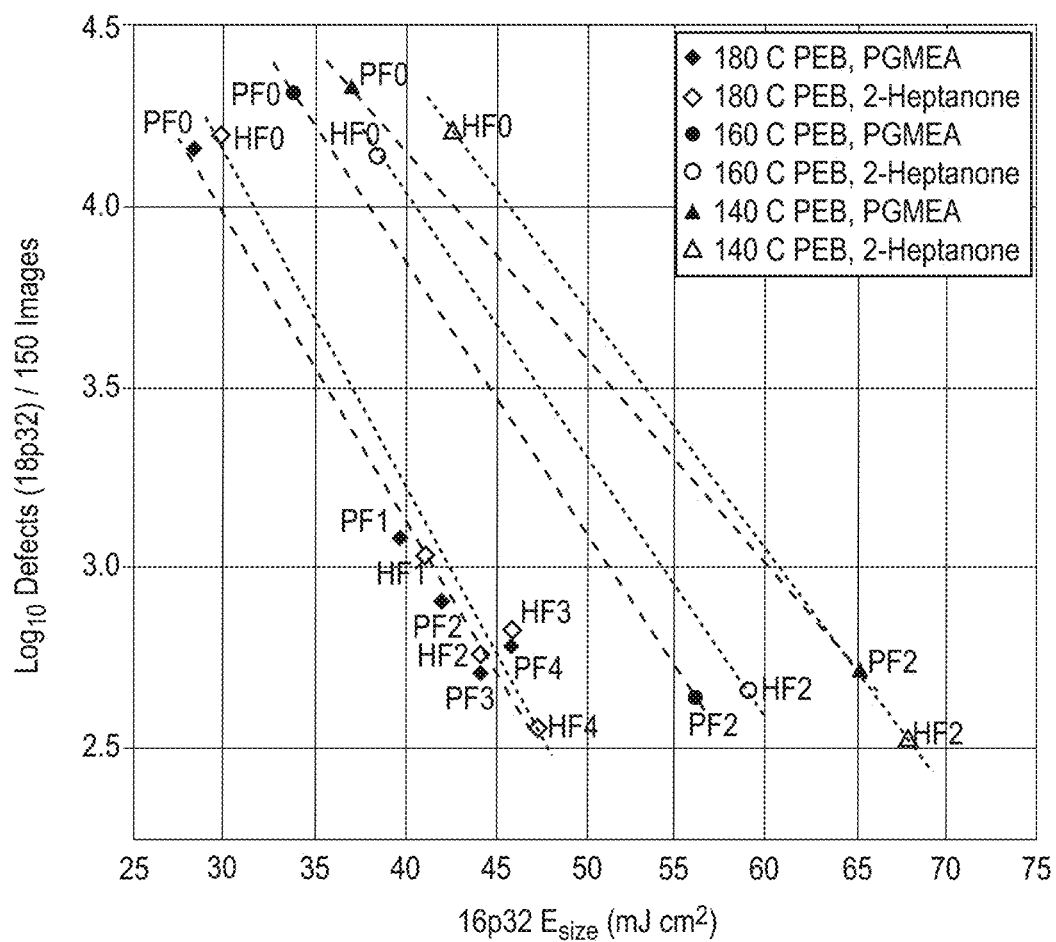
FIG. 13 is a log-linear plot of the estimated defect count per 150 images for an 18p32 pattern (Defects (18p32)/150 Images) as a function of the equivalent dose to size (16p32 $E_{size}$) for organometallic resist patterned via EUV lithography and with developer compositions HF0-HF4 and PF0-PF4 at 3 post-exposure bake (PEB) temperatures.
Figure 15:
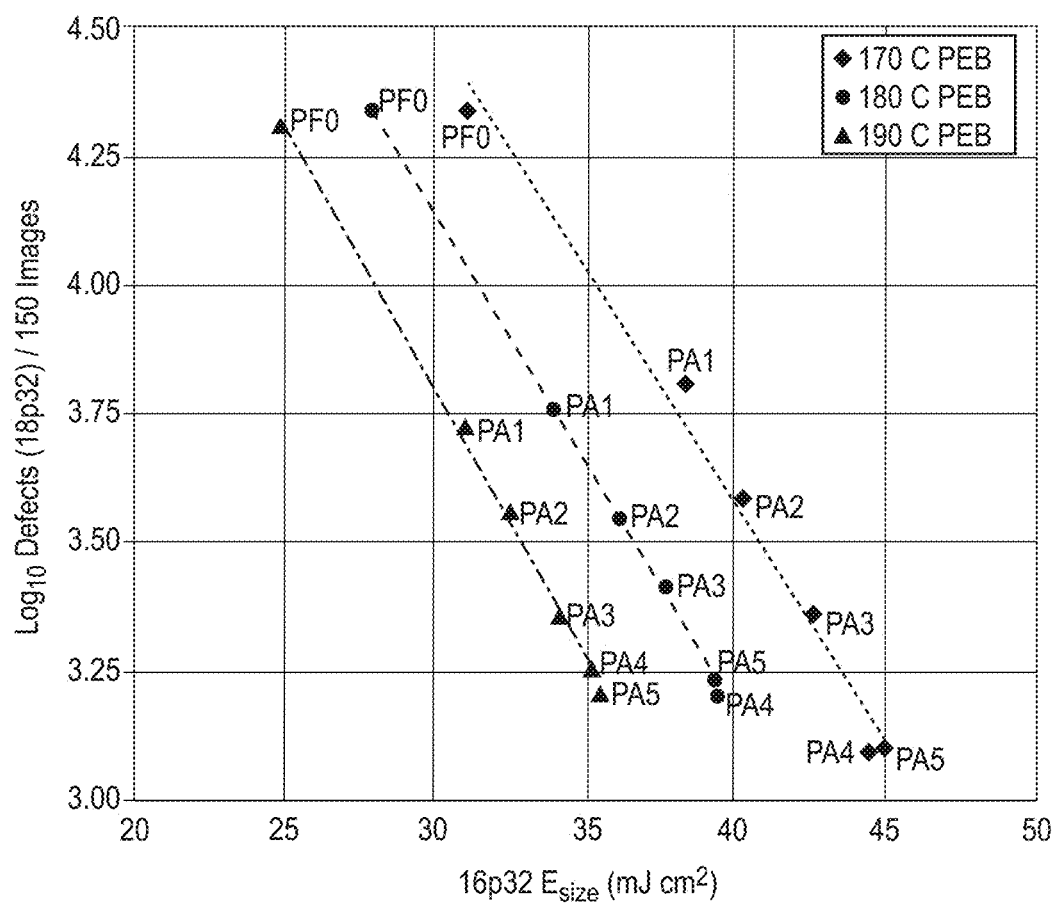
FIG. 15 is a log-linear plot of the estimated defect count per 150 images for an 18p32 pattern (Defects (18p32)/150 Images) as a function of the equivalent dose to size (16p32 $E_{size}$) for organometallic resist patterned via EUV lithography to form 32-nm pitch lines for developer compositions PF0 and PA1-PA5 at 3 post-exposure bake (PEB) temperatures.
Figure 16:
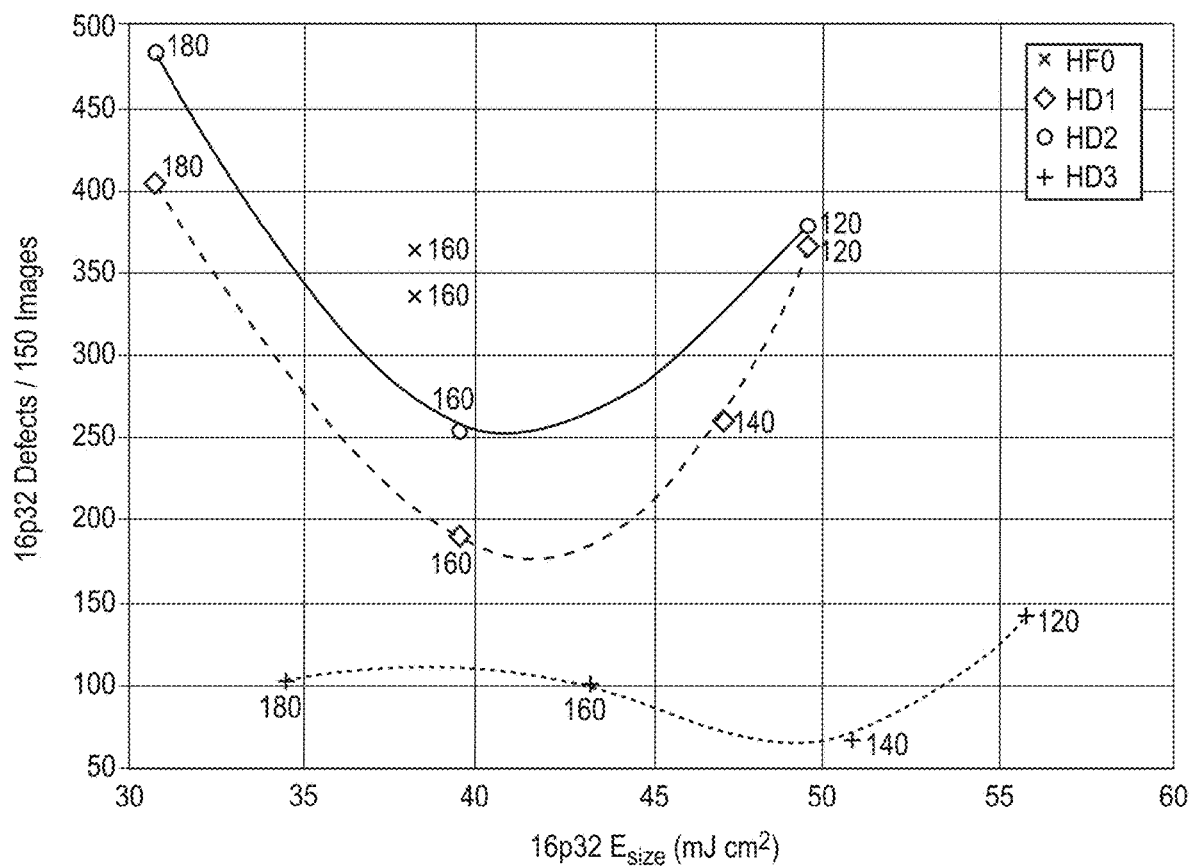
FIG. 16 is a plot of the estimated defect count per 150 images for an 16p32 pattern (Defects (16p32)/150 Images) as a function of the equivalent dose to size (16p32 $E_{size}$) for organometallic resist patterned via EUV lithography and with developer compositions PF0 and PA1-PA5 at 3 post-exposure bake (PEB) temperatures.
Figure 17:
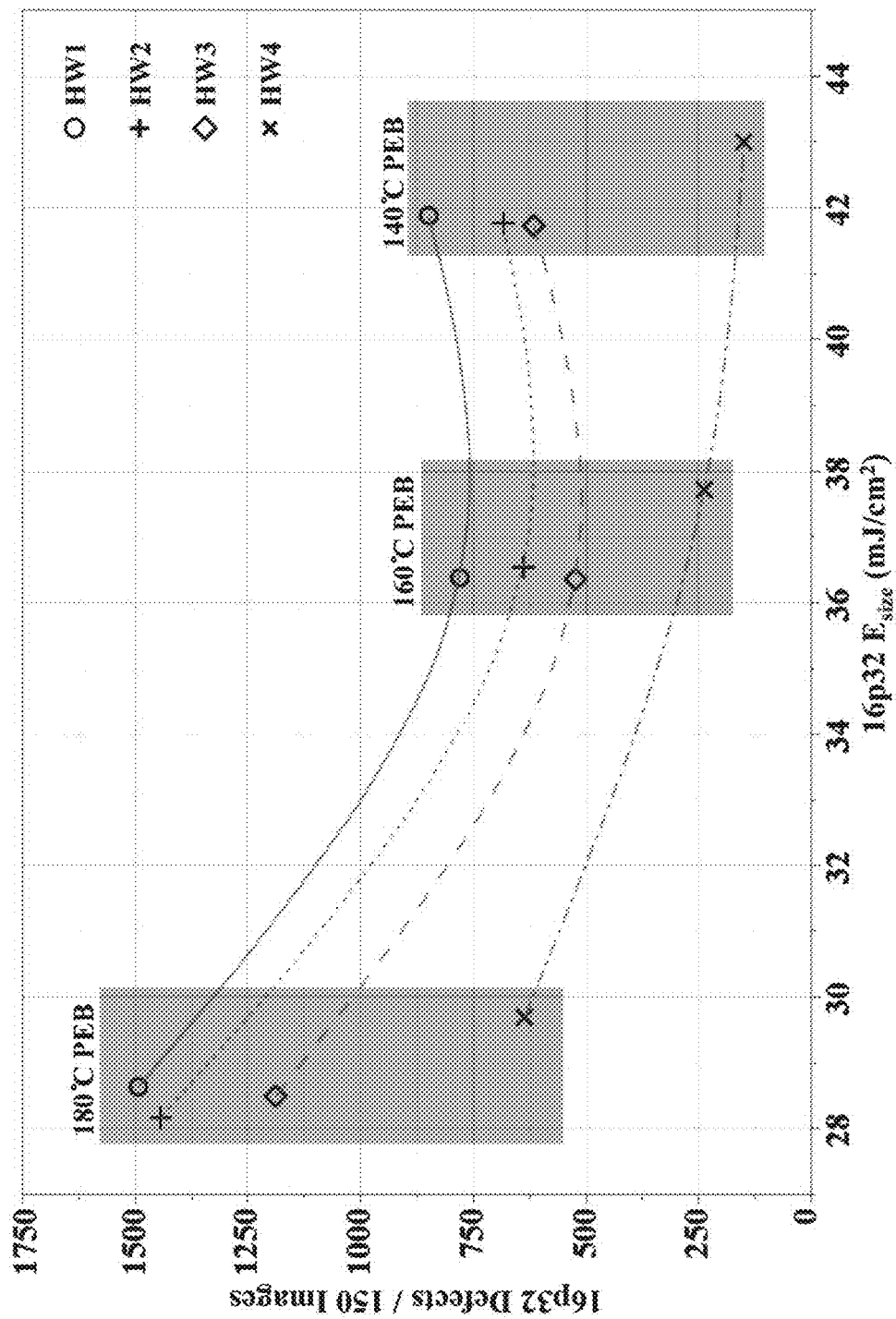
FIG. 17 is a plot of the estimated defect count per 150 images for an 16p32 pattern (Defects (16p32)/150 Images) as a function of the equivalent dose to size (16p32 $E_{size}$) for organometallic resist patterned via EUV lithography and with developer compositions HW1-HW4 at 3 post-exposure bake (PEB) temperatures.
Figure 18:
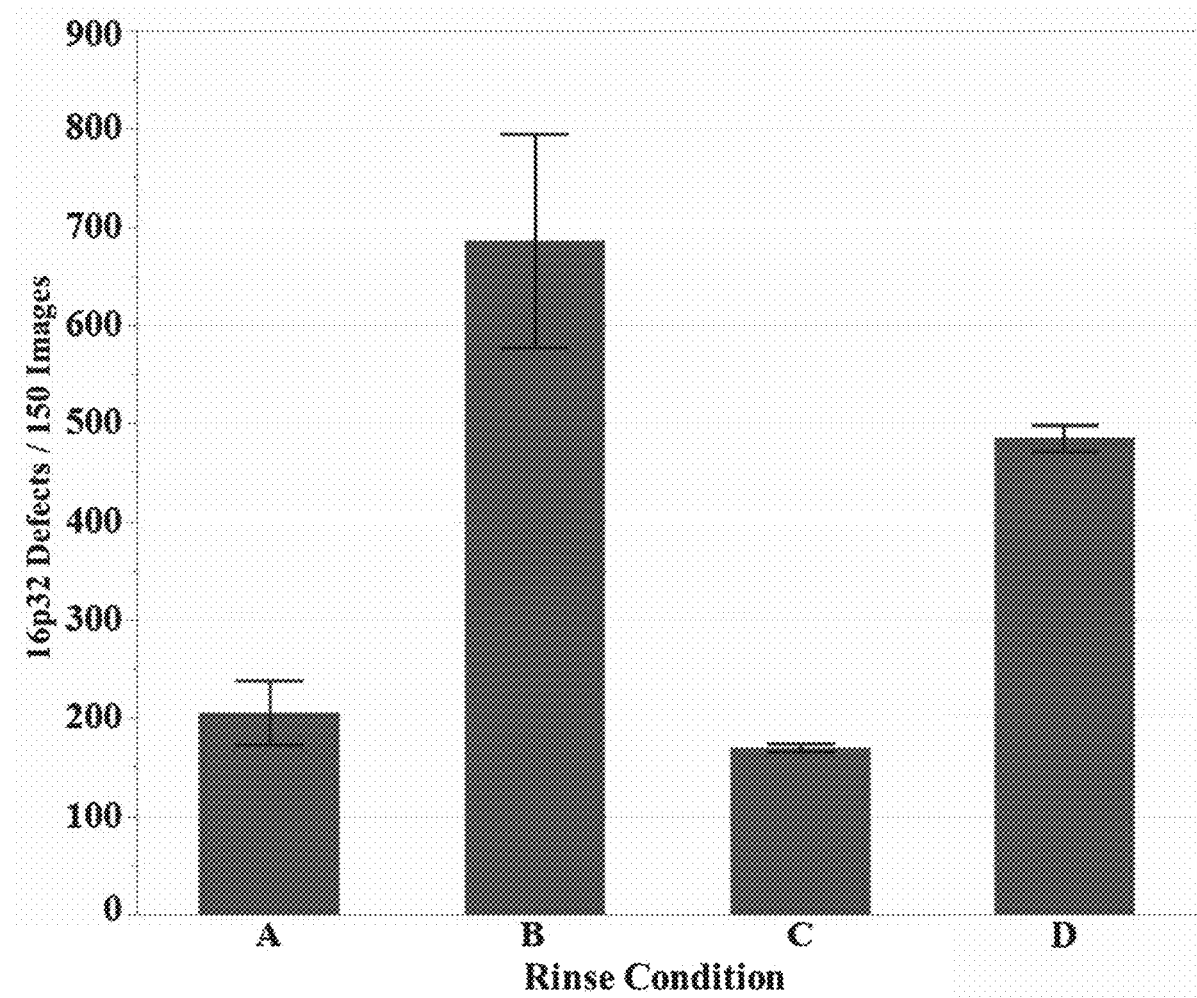
FIG. 18 is a plot of the estimated defect count per 150 images for an 16p32 pattern (Defects (16p32)/150 Images) as a function of the rinse condition for organometallic resist patterned via EUV lithography, developed with 2 vol % 1,2-hexanediol in 2-heptanone, and rinsed under various rinse conditions: (A) no rinse, (B) 15 second rinse with 2-heptanone, (C) 15 second rinse with 2 vol % 1,2-hexanediol in 2-heptanone, or (D) 15 second rinse with 2-heptanone followed by a 15 second rinse with 2 vol % 1,2-hexanediol in 2-heptanone.

Images were collected at a magnification of approximately 164,000×, a FOV of 0.823-by-0.823 μm, in TV scan, with an accelerating voltage of 800V and a beam current of 8 pA. 16 Frames were averaged per image. Stochalis image analysis software (developed at and available from the Interuniversity Microelectronics Centre, Belgium) was used to analyze each set of 150 images (operated in "Space" mode, with the following parameter settings: SumLines=4, Smoothing=7; CD_Threshold=61; DThres_nok_Space=90; and Lnok_min_Space=4) and the total number of microbridge defects detected for each field was tabulated. EUV image analuysis is described further in P. De Bisschop and E. Hendrickx "Stochastic effects in EUV lithography", Proc. SPIE 10583, Extreme Ultraviolet (EUV) Lithography IX, 105831K (19 Mar. 2018); https://doi.org/10.1117/12.2300541, incorporated herein by reference. By fitting an exponential function to the defect density versus CD curve constructed from the 4 data points per wafer, the microbridge defect density at a target CD (either 16 or 18 nm as specified in each example) spanned by the measured range was estimated and reported as the defects per 150 images or "Def/Die 16p32". The total sampling area for each 150 images is approximately 101.6 square microns. Results are presented in FIGS. 5-6 and 13 for developers containing formic acid additive; in FIGS. 8-9 for developers containing EHA additive; in FIG. 15 for developers containing acetic acid additive; in FIG. 16 for developers containing diol additive; in FIG. 17 for developers containing water as an additive; and in FIG. 21 for alcohol developer compositions. FIG. 13 shows the defect density on an 18p32 pattern for developers containing a formic acid additive. FIG. 15 shows the defect density on an 18p32 pattern for developers containing acetic acid additive. FIG. 18 shows the effect of rinse conditions on defect density. The disclosed additives and processing conditions are shown to generally reduce the defect density of patterned organotin oxide hydroxide photoresists.

Example 3. 2-Heptanone and Formic acid Developer Compositions

This example demonstrates the improved results obtained with a developer solution using a blend of 2-heptanone with formic acid, in which a significant reduction in microbridge defects is obtained.

A conventional 2-heptanone developer composition (HF0) was used as a control developer and as the rinse solvent.

A set of developer solutions were prepared by mixing 98% (w/w) pure formic acid with 2-heptanone at concentrations of either 2 vol % formic acid (D1) or 10 vol % formic acid (D2). Prior to formulation, all glassware was rinsed three times with isopropyl alcohol and baked at 100° C. for 24 h. Preparation took place in a fume hood. A known volume of 2-heptanone (EUVR developer, TOK America, 100-300 ppm $H_2O$) was dispensed into a glass bottle. A volume required to achieve the target vol % of formic acid (from EMD Millipore) was then added to the bottle via graduated cylinder or autopipette, and the mixture capped and placed on a shaker table to thoroughly mix.

Wafers were coated, exposed, developed, rinsed, and analyzed according to Example 2. The rinse solvent was 2-heptanone. All of the samples were tested at post-exposure bake temperatures of 140° C., 160° C., and 180° C. Samples (D1) and (D2) were additionally tested at a post-exposure bake temperature of 120° C. The samples were then developed with either (HD0), (D1), or (D2). A final 60 second hotplate bake at 150° C. in air was performed after development.

If it is assumed that the formic acid stock had 2 weight percent water, then the 10 vol % formic acid developer solution had about 3000 ppm water, and the 2 vol % formic acid developer solution had about 600 ppm water. The separate effect of water in the 2-heptanone solution is explored in Example 9, but the water effect in these developer samples is significantly less than the formic acid effect.

Figure 4:
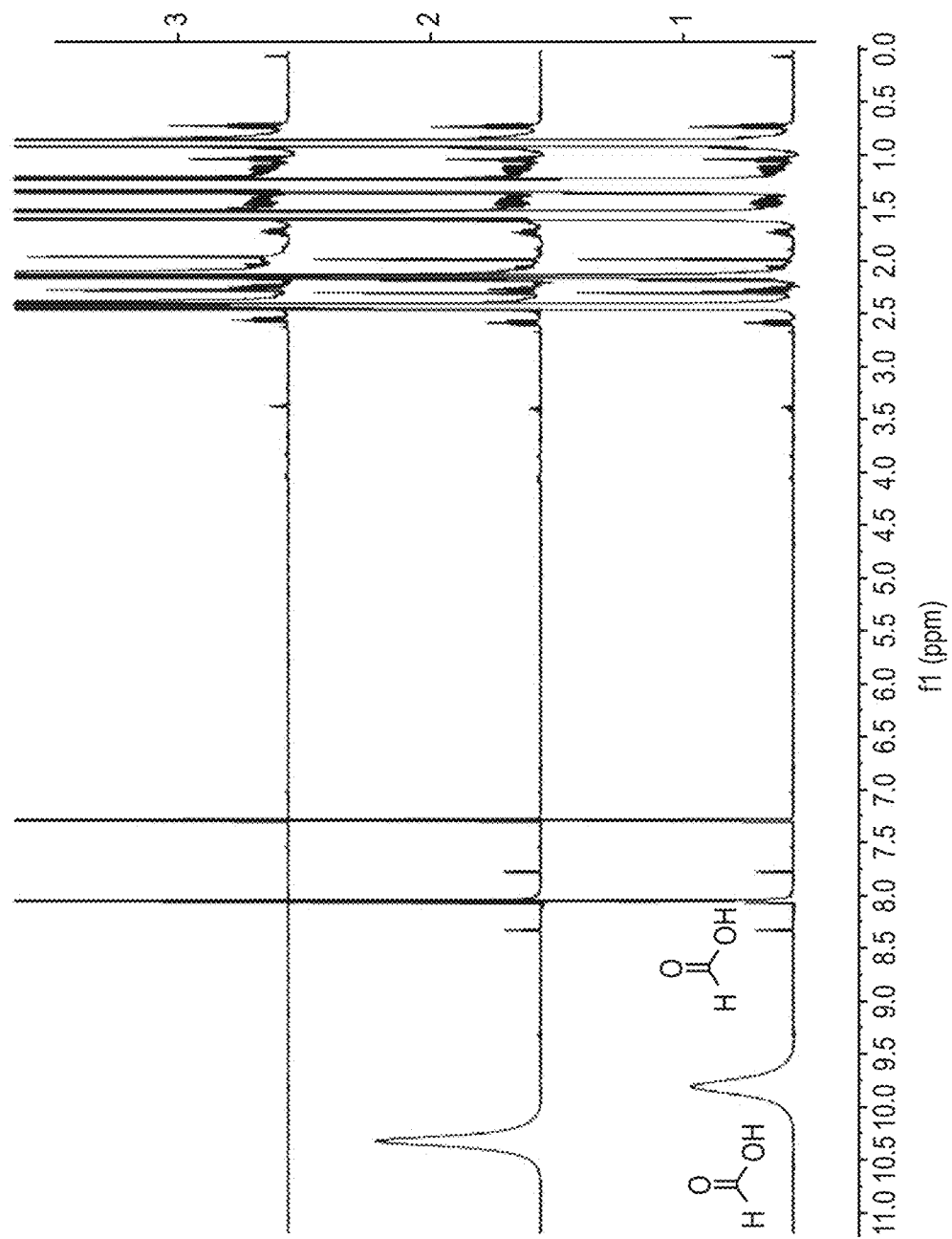
FIG. 4 is a set of three $^1$H NMR spectra for 2-heptanone (top), 10 vol % formic acid in 2-heptanone at time t=0 (middle), and 10 vol % formic acid in 2-heptanone at time t=1 week (bottom). Results show the stability of the formic acid solutions over a 1 week time frame.

$^1$H NMR analysis of the developer composition (D2) was performed upon preparation and after one week and compared to the 2-heptanone control developer (HF0) of Example 2. See FIG. 4. The NMR results suggest that the developer composition was stable over a 1-week time frame.

Figure 5:
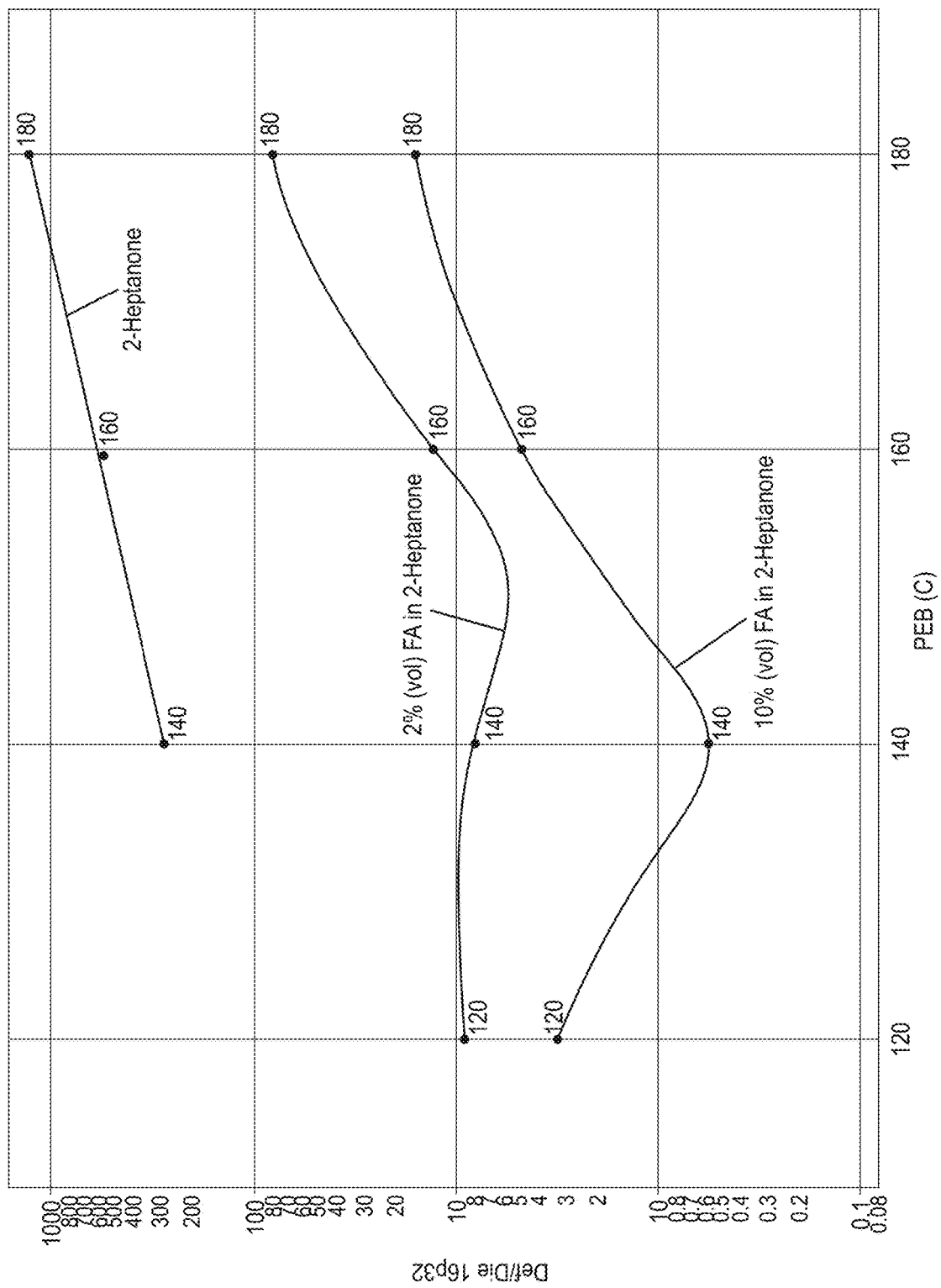
FIG. 5 is a plot of the microbridge density (Def/Die 16p32) as a function of post-exposure bake temperature for organometallic resist patterned via EUV lithography to form 32-nm pitch lines for three developer compositions: 2 vol % formic acid in 2-heptanone, 10 vol % formic acid in 2-heptanone, or 2-heptanone.

FIG. 5 provides the microbridge density as a function of post-exposure bake temperature. A reduction in microbridge density as compared to a 2-heptanone control developer (HF0) is observed at all tested PEB temperatures for (D1) and (D2).

Figure 6:
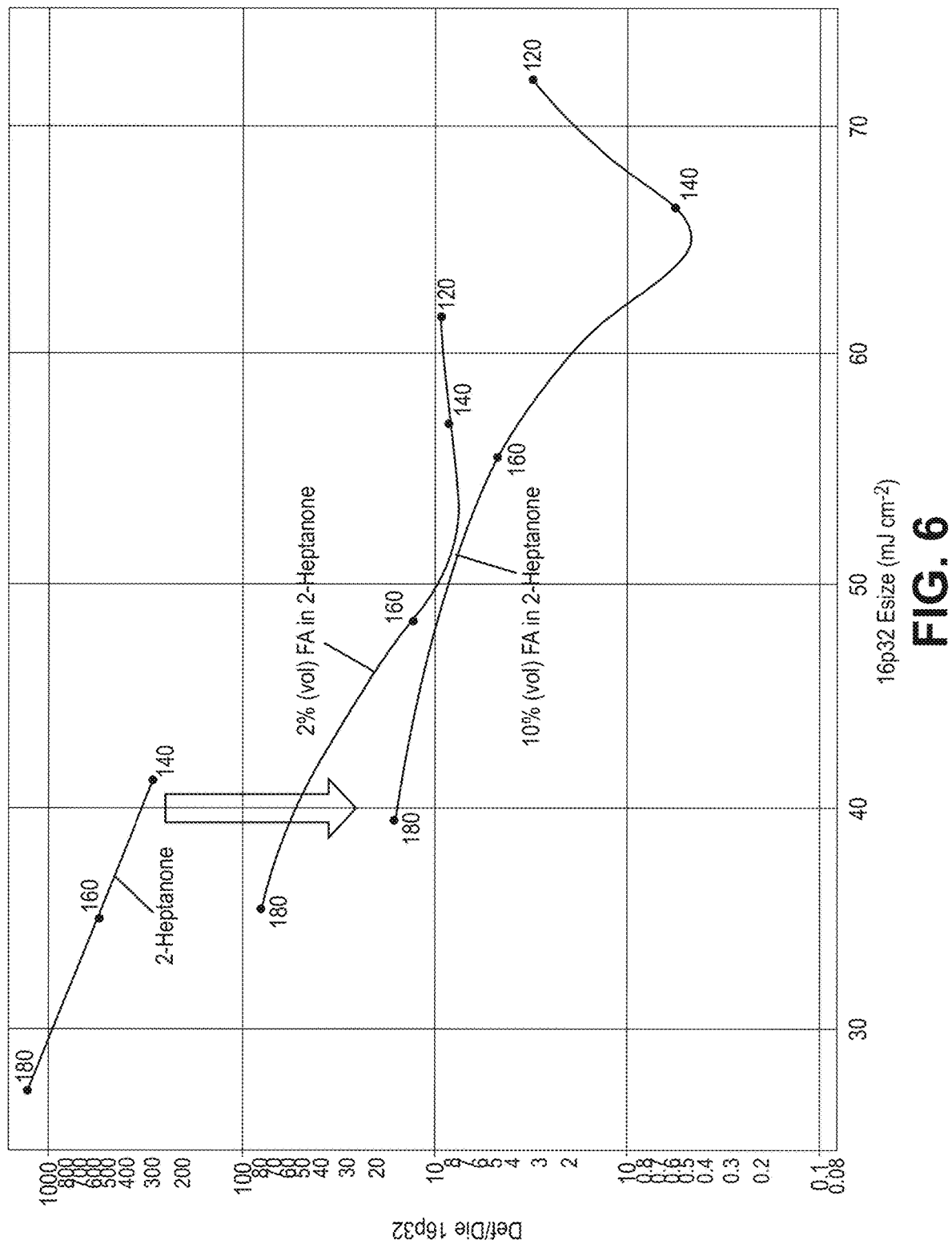
FIG. 6 is a plot of the microbridge density (Def/Die 16p32) as a function of the equivalent dose density (16p32 $E_{size}$) for organometallic resist patterned via EUV lithography to form 32-nm pitch lines for three developer compositions: 2 vol % formic acid in 2-heptanone, 10 vol % formic acid in 2-heptanone, and 2-heptanone.

FIG. 6 provides the microbridge density as a function of the equivalent dose density. Although dose at a set PEB is found to increase, by shifting process PEB temperature, defectivity can be reduced at an equivalent dose to size ($E_{size}$).

Figure 7:
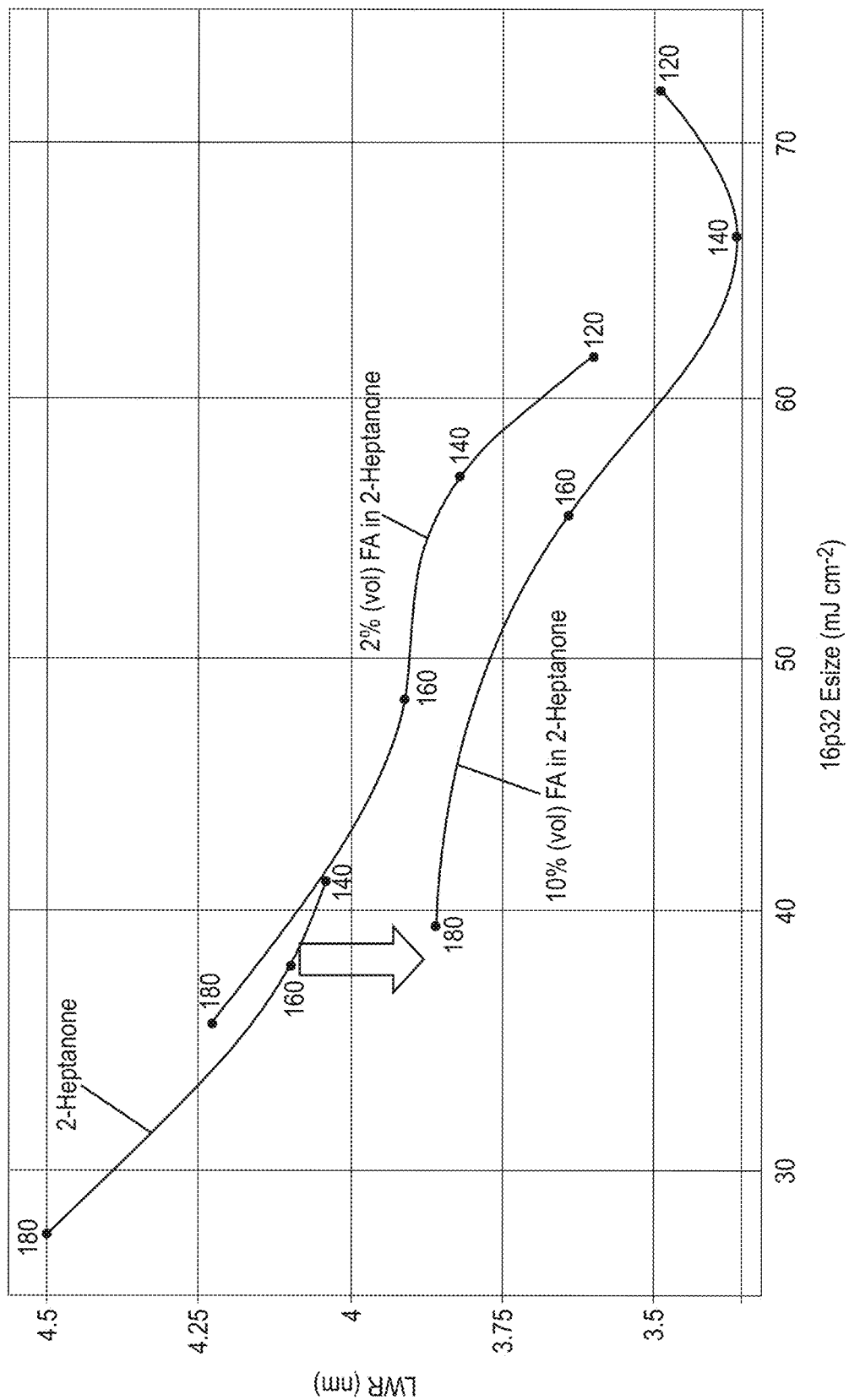
FIG. 7 is a plot of the line width roughness (LWR) in nanometers as a function of the equivalent dose to size (16p32 $E_{size}$) for organometallic resist patterned via EUV lithography to form 32-nm pitch lines for three developer compositions: 2 vol % formic acid in 2-heptanone, 10 vol % formic acid in 2-heptanone, and 2-heptanone.

FIG. 7 provides the line width roughness (LWR) in nanometers as a function of the equivalent dose to size. Although dose at a set PEB is found to increase, by shifting process PEB temperature, LWR can be reduced at an equivalent dose density (mJ/cm$^2$).

The data from FIGS. 5-7 indicates that developer compositions with 2-10% (vol) formic acid additive in 2-heptanone can reduce microbridge density in organotin resist patterns with 16-nm lines on a 32-nm pitch relative to a 2-heptanone control developer composition. The reduction of microbridge density is approximately an order of magnitude at equivalent dose density and up to approximately two orders of magnitude with a substantial dose penalty. Increased additive concentration is shown to reduce the microbridging density at a given PEB temperature or dose density. Increased additive concentration is shown to generally decrease the line width roughness at a given dose density.

Example 4. 2-Heptanone and 2-Ethylhexanoic Acid (EHA) Developer Compositions

This example demonstrates the improved results obtained with a developer solution using a blend of 2-heptanone with ethylhexanoic acid, in which a significant reduction in microbridge defects is obtained.

A conventional 2-heptanone developer composition (HF0) was used as a control developer and as the rinse solvent.

A set of developer solutions were prepared by mixing neat ethylhexanoic acid (EHA) with 2-heptanone at concentrations of either 2 vol % EHA (D3) or 10 vol % EHA (D4). Prior to formulation, all glassware was rinsed three times with isopropyl alcohol and baked at 100° C. for 24 h. Preparation took place in a fume hood. A known volume of 2-heptanone (EUVR developer, TOK America, 100-300 ppm $H_2O$) was dispensed into a glass bottle. A volume required to achieve the target vol % of EHA (Alfa Aesar) was then added to the bottle via graduated cylinder or autopipette, and the mixture capped and placed on a shaker table to thoroughly mix.

Wafers were coated, exposed, developed, rinsed, and analyzed according to Example 2. The rinse solvent was 2-heptanone. All of the samples were tested at post-exposure bake temperatures of 140° C., 160° C., and 180° C. The samples were then developed with either (HD0), (D3), or (D4). A final 60 second hotplate bake at 150° C. in air was performed after development.

Figure 8:
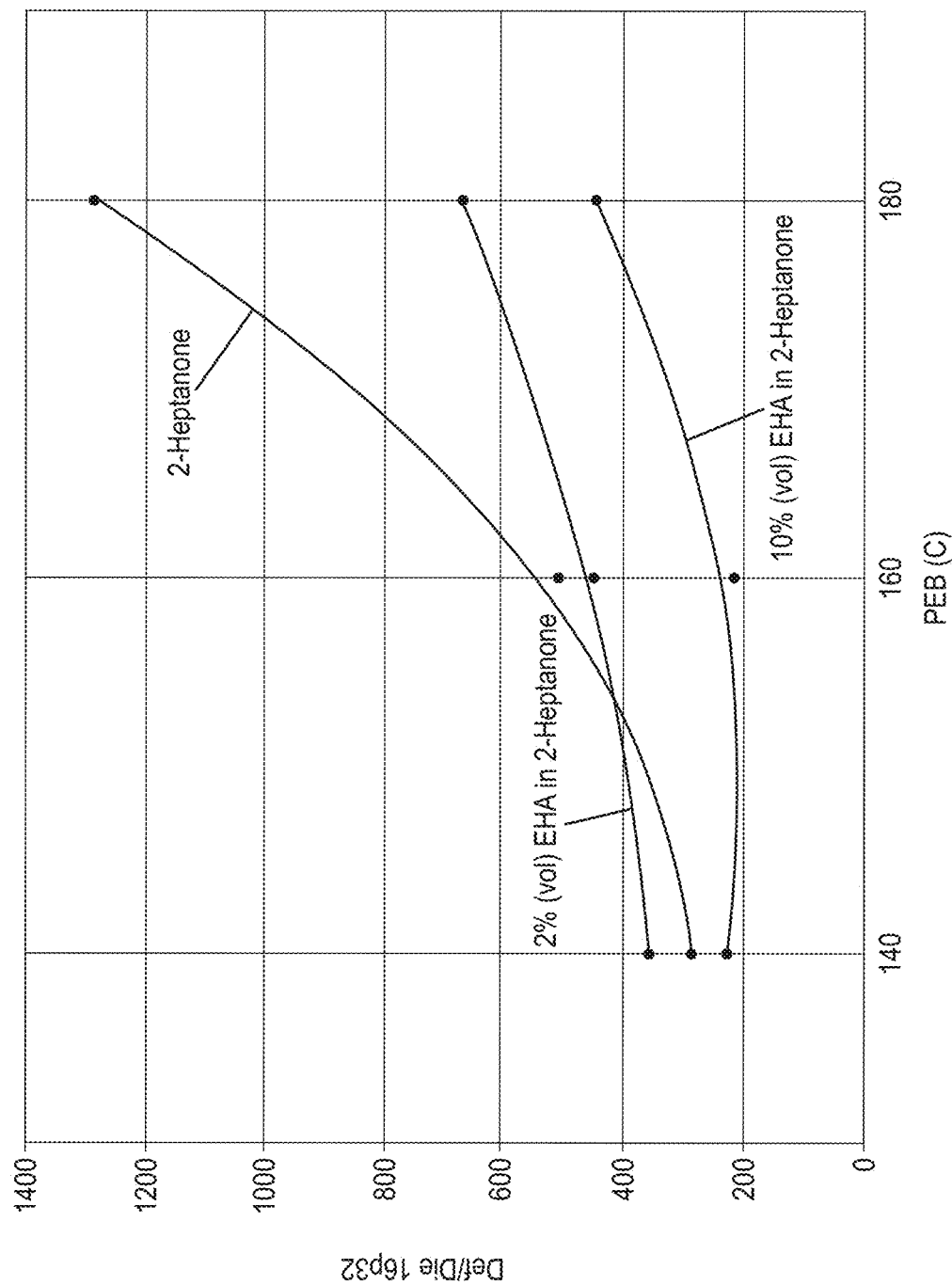
FIG. 8 is a plot of the microbridge density (Def/Die 16p32) at a target CD of 16 nm as a function of post-exposure bake temperature for organometallic resist patterned via EUV lithography to form 32-nm pitch lines for three developer compositions: 2 vol % ethylhexanoic acid (EHA) in 2-heptanone, 10 vol % EHA in 2-heptanone, and 2-heptanone.

FIG. 8 provides the microbridge density at a target CD of 16 nm as a function of post-exposure bake temperature. A reduction in microbridge density as compared to a 2-heptanone control developer (HF0) is observed at several tested PEB temperatures for (D3) and (D4).

Figure 9:
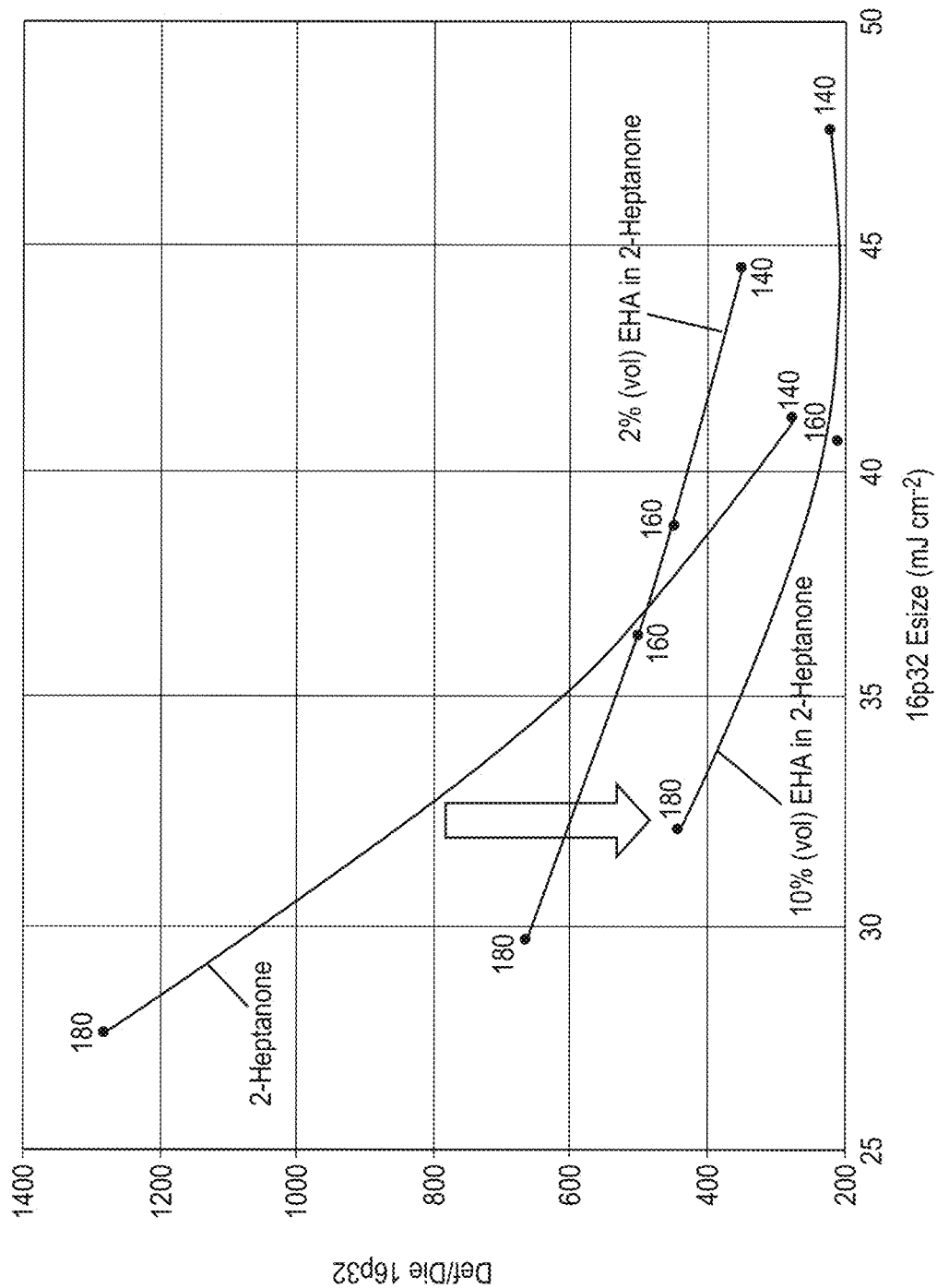
FIG. 9 is a plot of the microbridge density (Def/Die 16p32) as a function of the equivalent dose density (16p32 $E_{size}$) for organometallic resist patterned via EUV lithography to form 32-nm pitch lines for three developer compositions: 2 vol % ethylhexanoic acid (EHA) in 2-heptanone, 10 vol % EHA in 2-heptanone, and 2-heptanone.

FIG. 9 provides the microbridge density as a function of the equivalent dose density for control developer (HF0) and (D3) and (D4). Although dose at a set PEB is found to increase, by shifting process PEB temperature, defectivity can be reduced at an equivalent dose density.

The data from FIGS. 8-9 indicates that developer compositions with 2-10% (vol) EHA additive in 2-heptanone can reduce microbridge density in organotin oxide hydroxide photoresist patterns with 16-nm lines on a 32-nm pitch relative to a 2-heptanone control developer composition. A clear reduction in microbridge density is observed for the EHA containing developers at post-exposure bake temperatures at 160° C. and 180° C. In FIG. 7, it is seen that the microbridge density at 180° C. PEB temperature with developer (D4) is approximately one-third of the microbridge density observed with the control developer (HF0). Additionally, a reduction in microbridge density at a post-exposure bake temperature of 120° C. is observed for (D4), the developer with the higher EHA concentration (10 vol % EHA). FIG. 8 shows that increasing the additive concentration from 2 vol % to 10 vol % resulted in a reduction of the microbridging density at a given dose density. The increase in additive concentration was generally correlated with a reduction in defect density, however, the results show that the performance of the developer solutions in comparison to the control developer is affected by the PEB temperature and the dose density. At 140° C. or about 42 mJ/cm², the 2 vol % EHA did not perform better than the control developer. The positive effect of the EHA additive is particularly pronounced at lower dose densities. For example, 2 vol % EHA provides a reduction in defects as compared to the control developer (HF0) of about a factor of 1.7 at a dose density of 30 mJ/cm².

Example 5. Organic Solvent and Carboxylic Acid Developer Compositions

This example describes the preparation of developer solutions composed of 2-heptanone or PGMEA with formic acid or acetic acid as additives.

Prior to formulation, all glassware was rinsed three times with isopropyl alcohol and baked at 100° C. for 24 h. Preparation took place in a fume hood. A known volume of solvent, either 2-heptanone (EUVR developer, TOK America, 100-300 ppm H$_2$O) or propylene glycol methyl ether acetate (PGMEA, Sigma Aldrich, 99.5%) was dispensed into a glass bottle. A volume required to achieve the target vol % of acetic acid (J. T. Baker, 99.5-100.5%) or formic acid (98-100%, EMD) was then added to the bottle via graduated cylinder or autopipette, and the mixture capped and placed on a shaker table to thoroughly mix. The volume percentage of additive added relative to the total volume of added acid and added solvent was varied to produce the solutions listed in Table 2.

TABLE 2

| Developer Solution | Solvent | Vol % Solvent | Additive | Vol % Additive |
| --- | --- | --- | --- | --- |
| HF0 | 2-Heptanone | 100 | N/A | 0 |
| HF1 | 2-Heptanone | 95 | Formic Acid | 5 |
| HF2 | 2-Heptanone | 90 | Formic Acid | 10 |
| HF3 | 2-Heptanone | 85 | Formic Acid | 15 |
| HF4 | 2-Heptanone | 80 | Formic Acid | 20 |
| PF0 | PGMEA | 100 | N/A | 0 |
| PF1 | PGMEA | 95 | Formic Acid | 5 |
| PF2 | PGMEA | 90 | Formic Acid | 10 |
| PF3 | PGMEA | 85 | Formic Acid | 15 |
| PF4 | PGMEA | 80 | Formic Acid | 20 |
| PA1 | PGMEA | 99 | Acetic Acid | 1 |
| PA2 | PGMEA | 98 | Acetic Acid | 2 |
| PA3 | PGMEA | 95 | Acetic Acid | 5 |
| PA4 | PGMEA | 92.5 | Acetic Acid | 7.5 |
| PA5 | PGMEA | 90 | Acetic Acid | 10 |

Examples 6 and 7 present the performance data for the developer compositions of Table 2.

Example 6. Analysis of Microbridging from Formic Acid Containing Developers of Example 5

This example demonstrates the improved patterning performance obtained with formic acid as a developer additive. Organotin oxide hydroxide photoresist patterns are developed with developer solutions using a blend of 2-heptanone or PGMEA with formic acid, prepared as shown in Example 5. The 16p32 images were analyzed for dose to size and LWR, and patterns for four fields were evaluated for defect count based on a CD of 18 nm, as described in Example 2. Improved performance is generally observed for the developers with the formic acid additives as compared to the control developers, with marked improvements observed with increasing line CD.

Organotin oxide hydroxide photoresist precursor solutions and photoresist films were prepared and processed as described in Example 2 to form line-space patterns on a 32-nm pitch. Developer solutions HF0-HF4 and PF0-PF4 from Example 5 were utilized in the development step and all wafers received a 10 second rinse with their corresponding developer solution. All eight developer solutions were tested on wafers receiving a PEB at 180° C., while only developer solutions (HF0), (PF0), (HF2), and (PF2) were tested on wafers subjected PEBs at 140° C. and 160° C.

Representative SEMs of the resulting 32-nm pitch patterns from the field with an average line CD closest to 16 nm are presented for each wafer in FIG. 10 and FIG. 11. At equivalent PEB temperatures, developer solutions with formic acid additives are found to cause an increase in field dose, which is approximately equivalent to E$_{size}$, and a reduction in LWR relative to the control solvents that correlates with an increase in the volume percent of formic acid in the developer solution. This trend is visually apparent as well, as patterns developed in solutions containing higher concentrations of formic acid additive exhibit reduced scumming and microbridge incidence even in the small area sampled by a single image. As shown in FIG. 11, at 180° C. PEB a developer solution comprised of neat PGMEA (PF0) is unable to consistently resolve the line-space pattern and large numbers of particle, bridge, and scum defects are apparent. However, when a formic acid additive is present in the same solvent, image fidelity is substantially improved at all additive levels tested.

Figure 12A:
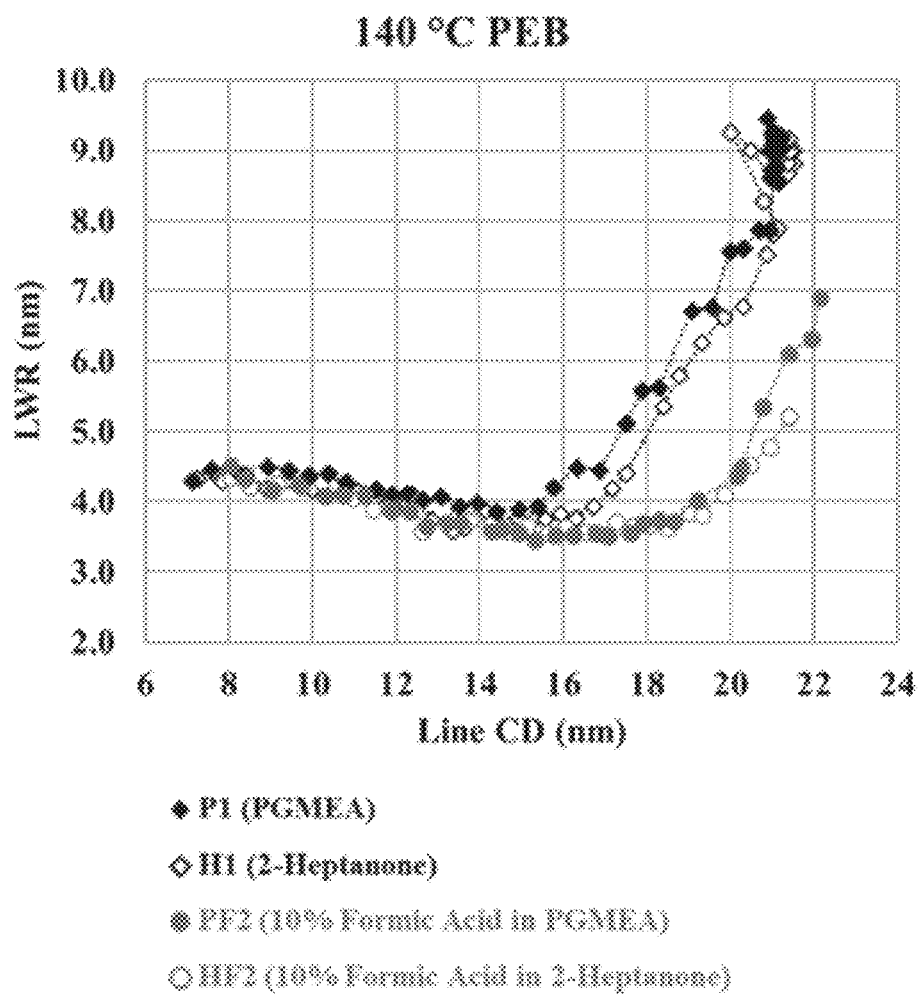
FIG. 12A is a plot of the line width roughness (LWR) in nanometers as a function of the line CD in nanometers at a post-exposure bake (temperature) of 140° C. for four developer compositions: PGMEA, 2-heptanone, 10 vol % formic acid in PGMEA, and 10 vol % formic acid in 2-heptanone.
Figure 12B:
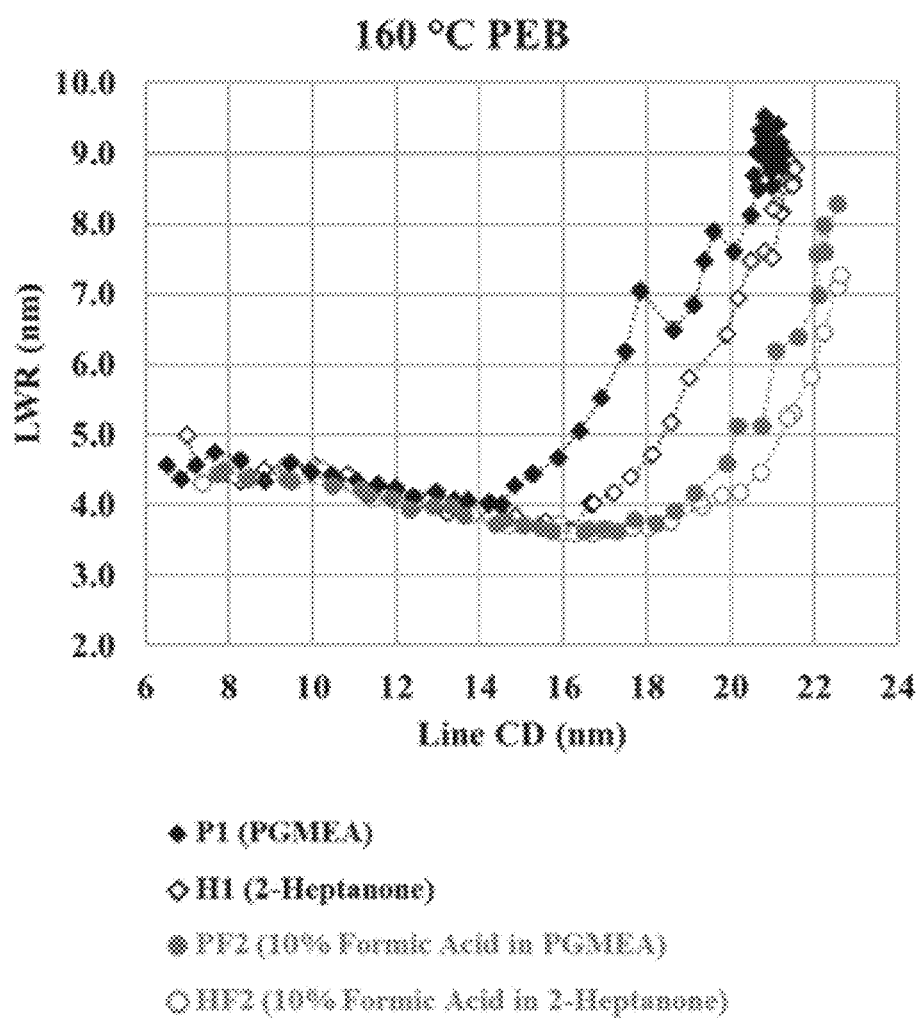
FIG. 12B is a plot of the line width roughness (LWR) in nanometers as a function of the line CD in nanometers at a post-exposure bake (temperature) of 160° C. for four developer compositions: PGMEA, 2-heptanone, 10 vol % formic acid in PGMEA, and 10 vol % formic acid in 2-heptanone.
Figure 12C:
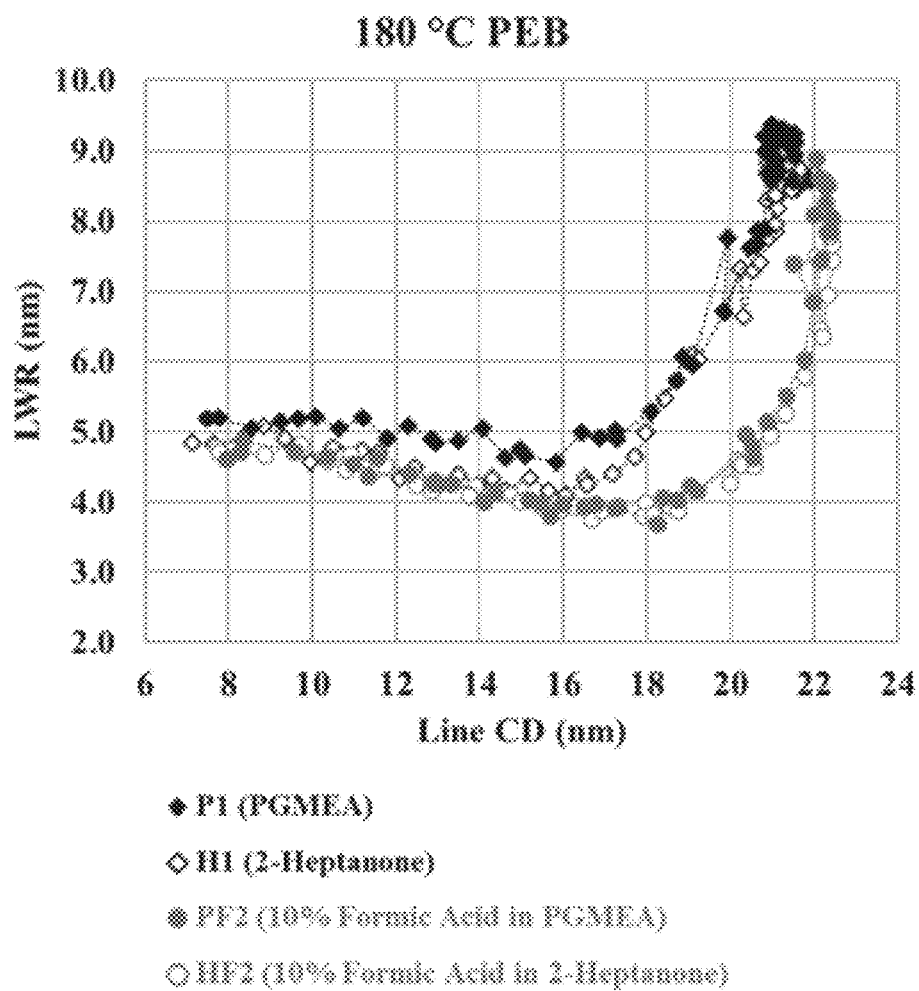
FIG. 12C is a plot of the line width roughness (LWR) in nanometers as a function of the line CD in nanometers at a post-exposure bake (temperature) of 180° C. for four developer compositions: PGMEA, 2-heptanone, 10 vol % formic acid in PGMEA, and 10 vol % formic acid in 2-heptanone.

LWR values for all fields with a measurable line CD for all 12 wafers represented in FIG. 10 are plotted as a function of CD in FIGS. 12A-12C for PEB temperatures, 140° C., 160° C., and 180° C., respectively. For each PEB temperature at low CDs (and concomitantly low doses) all developer solutions appear to have a similar effect on LWR with the previously noted exception of the control developer (PF0). A modest LWR reduction at a fixed CD is generally observed for (PF2) and (HF2) relative to development with control developers (PF0) and (HF0). However, as line CD approaches 16 nm a strong divergence is observed. The LWR of patterns developed in (PF0) and (H0) begins to increase rapidly, while the LWR of those developed in (PF2) and (HF2) continues to slowly decrease before eventually beginning to increase as CDs exceed ~18 nm. To the extent a lithographic process window is constrained by LWR and edge placement error, (as many advanced-node applications may be) the larger line sizes printable prior to this "LWR take-off" represent an extension of the effective process window of the photoresist when developed with the formic acid-containing developer solutions as disclosed herein.

The microbridge defect analysis methodology described in Example 2 was similarly applied to the 18 wafers described above. A target CD of 18 nm was selected and 150 SEM images collected and analyzed from each of 4 fields with a CD near the target on each wafer. After image analysis, defect counting, and curve fitting, an estimate of the defect count per 150 images for an 18p32 pattern at each process condition was produced. The logarithm (base 10) of this number is plotted versus $E_{size}$(at 16p32) in FIG. 13. Developer solutions used for each wafer are indicated in data point labels. For the 180° C. PEB condition, a strong reduction (~50×) in the number of microbridge defects is clearly observed at even the lowest vol % formic acid tested (PF1, HF1) relative to the control developers (PF0, HF0). The number of defects continues to reduce as the vol % of formic acid is increased from (HF1) and (PF1) to (HF4) and (PF4). At all PEBs tested, (HF2) and (PF2) are found to afford an approximately similar (500×) reduction in defectivity relative to (HF0) and (PF0). Notably, while these substantial reductions in defectivity at a fixed PEB occur at an increased dose ($E_{size}$), a comparison of data points and trendlines at approximately equal dose conditions (i.e. HF0, 160° C. and HF1, 180° C. or HF0, 140° C. and HF2,180° C.) show that developer additive can be used in tandem with other process conditions to substantially reduce defectivity at nominally equivalent doses.

Example 7. Analysis of Microbridging from Acetic Acid Containing Developers of Example 5

This example demonstrates the improved patterning performance obtained with acetic acid as a developer additive. Organotin oxide hydroxide photoresist patterns are developed with developer solutions using a blend of PGMEA with acetic acid. A significant reduction in microbridge defects is demonstrated with the use of high resolution imaging.

Organotin oxide hydroxide photoresist precursor solutions and photoresist films were prepared and processed as described in Example 2 to form line-space patterns on a 32-nm pitch. Developer solutions PA1-PA5, were prepared by mixing acetic acid and PGMEA as described in Example 5. All wafers were rinsed with their corresponding developer solution. Each of the five developer solutions were tested on wafers processed with PEBs of 170° C., 180° C., and 190° C. and compared with (PF0).

Figure 14:
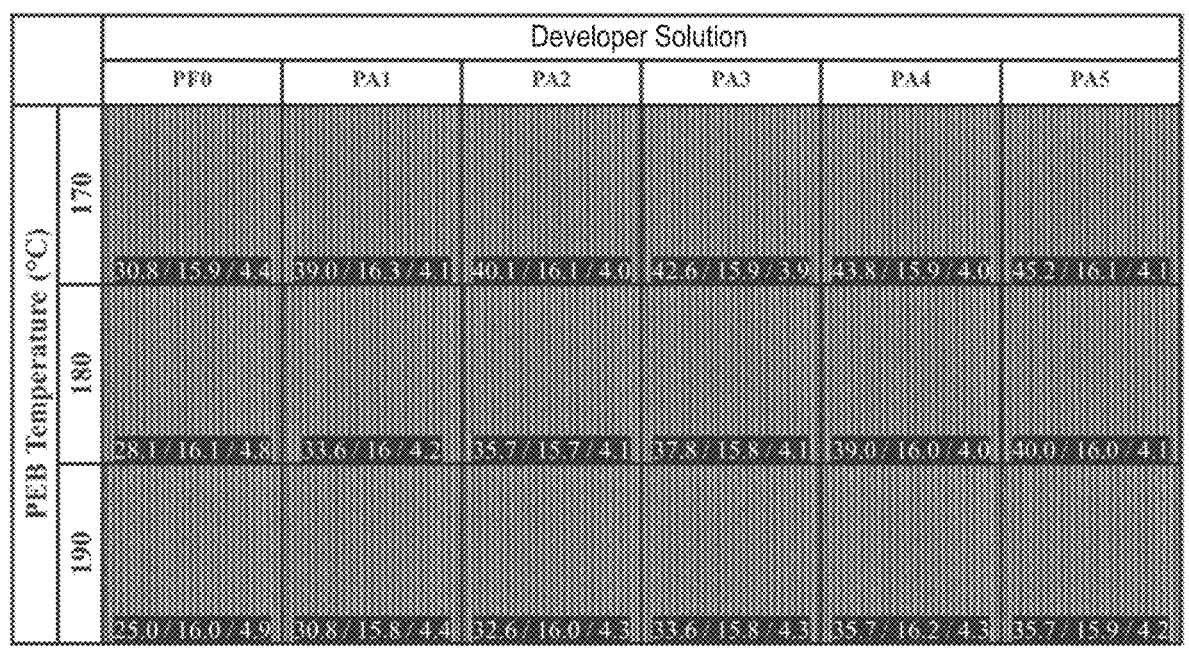
FIG. 14 is an array of 18 scanning electron micrograph (SEM) images of a silicon substrate with organometallic resist patterned via EUV lithography to form 32-nm pitch lines with each image from the field with an average line CD closest to 16 nm with the top row of four SEM images corresponding to a post-exposure bake (PEB) temperature of 170° C., with the second row of four SEM images corresponding to processing with a PEB temperature of 180° C., with the bottom row of four SEM images corresponding to processing with a PEB temperature of 190° C., in which the four images in each row from left to right correspond to developing with PGMEA (PF0), 1 vol % acetic acid in PGMEA (PA1), 2 vol % acetic acid in PGMEA (PA2), 5 vol % acetic acid in PGMEA (PA3), 7.5 vol % acetic acid in PGMEA (PA4), 10 vol % acetic acid in PGMEA (PA5), respectively.

Representative SEMs of the resulting 32-nm pitch patterns from the field with an average line CD closest to 16 nm are presented for each wafer in FIG. 14. At equivalent PEB temperatures, developer solutions with acetic acid additives are found to cause an increase in field dose, which is approximately equivalent to $E_{size}$, and a reduction in LWR relative to the control solvent that generally correlates with an increase in the volume percent of aceitc acid in the developer solution.

The microbridge defect analysis methodology described in Example 2 was applied to the resulting line-space patterns using an 18-nm target CD. The logarithm of the fitted defect count per 150 images for a 18p32 field for each wafer is plotted versus $E_{size}$(at 16p32) in FIG. 15. Developer solutions used for each wafer are indicated in data point labels. For all PEB conditions, a strong reduction (~50×) in the number of microbridge defects is again observed, even at 1 vol % acetic acid in PGMEA (PA1) relative to the control developer (PF0). As was seen with formic acid, the number of defects continues to reduce as the vol % of acetic acid is increased to 10% (PA5). Likewise, a comparison of data points and trendlines at approximately equal dose conditions (i.e. PF0, 170° C. and PA1, 190° C.) indicate that the acetic acid additive may be used in tandem with other process conditions to substantially reduce defectivity with no dose penalty.

Example 8. 2-Heptanone and Diol Developer Compositions

This example demonstrates the improved patterning performance obtained with diols as the developer additive. Organotin oxide hydroxide photoresist patterns are developed with developer solutions using a blend of 2-heptanone with 1,6-hexanediol, 1,2-hexanediol, or 1,2-propanediol. A significant reduction in microbridge defects is demonstrated with the use of high-resolution imaging.

Prior to formulation of the developer solutions, all glassware was rinsed three times with isopropyl alcohol and baked at 100° C. for 24 h. Preparation took place in a fume hood. A 2% by mass 1,6-hexanediol solution (HD1) was prepared by adding 10 g of 1,6-hexanediol (TCI) to a 500 mL volumetric flask containing ~400 mL 2-heptanone (TOK). The flask was swirled until dissolution was complete, and then diluted to a total volume of 500 mL with additional 2-heptanone.

A known volume of 2-heptanone (EUVR developer, TOK America, 100-300 ppm $H_2O$) was dispensed into a glass bottle. A volume required to achieve the target vol % of diol additive was then added to the bottle via graduated cylinder or autopipette, each solution was capped and placed on a shaker table to thoroughly mix.

A developer solution (HD2) was prepared by mixing 1,2-hexanediol (TCI, 96%) in 2-heptanone at 2 vol %.

A 10% by volume 1,2-propanediol solution was prepared by mixing 450 mL of 2-heptanone (TOK) and 50 mL of 1,2-propanediol (Sigma-Aldrich) in a 500 mL Kimax bottle. (HD3). Once fully combined, the solution was dispensed into two 240 mL amber glass bottles.

Wafers were coated, exposed, developed, rinsed, and analyzed according to Example 2.

(HD1) samples were tested at post-exposure bake temperatures of 120° C., 140° C., 160° C., and 180° C. and then developed and rinsed with the prepared developer composition.

(HD2) samples were tested at post-exposure bake temperatures of 120° C., 160° C., and 180° C. and then developed and rinsed with the prepared developer composition.

(HD3) samples were tested at post-exposure bake temperatures of 120° C., 140° C., 160° C., and 180° C. and then developed and rinsed with the prepared developer composition.

A control water wafer processed at a post-exposure bake temperature of 160° C. and developed and rinsed in (HF0) was also prepared.

The microbridge defect analysis methodology described in Example 2 was applied to the resulting line-space patterns using a 16-nm target CD. The fitted defect count per 150 images for a 16p32 field on each wafer is plotted versus $E_{size}$ (at 16p32) in FIG. 16. PEB temperatures for each wafer are indicated by datapoint labels. For wafers processed at 160° C. PEB, a clear reduction in defectivity is observed for developer solutions containing diol additives, with developer solution (HD3) (2% vol 1,2-propanediol in 2-heptanone) exhibiting the largest reduction (~3×) relative to (HD0). This trend continues across all PEB temperature tested, as (HD3)-developed wafers are found to have lower defectivities than those developed in (HD1) and (HD2) in all cases.

Example 9. 2-Heptanone and Water Developer Composition

This example demonstrates the improved patterning performance obtained with water as the developer additive. Organotin oxide hydroxide photoresist patterns are developed with developer solutions using a blend of 2-heptanone with water. A significant reduction in microbridge defects is demonstrated with the use of high-resolution imaging.

Developer solutions consisting of a mixture of 2-Heptanone and $H_2O$ were prepared by mixing 18 MΩ DI $H_2O$ in 2-heptanone (determined to have a trace $H_2O$ concentration of 150 ppm) to achieve the final concentrations shown in Table 3. The final concentrations were verified with Karl Fischer titration.

TABLE 3

| Developer Solution | Solvent | Additive | Additive Conc. (ppm) |
|---|---|---|---|
| HW1 | 2-Heptanone | $H_2O$ | 150 |
| HW2 | 2-Heptanone | $H_2O$ | 1000 |
| HW3 | 2-Heptanone | $H_2O$ | 3000 |
| HW4 | 2-Heptanone | $H_2O$ | 8000 |

Organotin oxide hydroxide photoresist precursor solutions and photoresist films were prepared and processed as described in Example 2 to form line-space patterns on a 32-nm pitch. Developer solutions HW1-HW4 were utilized in the development step. All wafers were rinsed with their corresponding developer solution. Each of the four developer solutions was tested on wafers processed with PEBs at 140° C., 160° C., and 180° C. The fitted defect count per 150 images for a 16p32 field on each wafer is plotted versus $E_{size}$ (at 16p32) in FIG. 17. PEB temperatures for each wafer are indicated by datapoint labels. A trend of decreasing defectivity with increasing $H_2O$ concentration is observed at all tested PEBs, with wafers developed with solution (HW4) (8000 ppm) exhibiting a 2-3× reduction in microbridge density, and an typical dose shift of <2 mJ/cm² relative to wafers developed with solution (HW1) containing only trace (150 ppm) $H_2O$.

Example 10. 2-Heptanone and 1,2-Hexanediol Developer with Varied Rinse Conditions This example demonstrates the improved patterning performance obtained with rinsing using a diol-additive solution. Organotin oxide hydroxide photoresist patterns are developed with a developer solution of 2-heptanone with 2 vol % 1,2-hexanediol and rinsed under various rinse conditions. High resolution imaging is used to show that rinsing with a developer solution with a diol-additive further reduces microbridge defects as compared to rinsing with the developer solution without the diol additive.

Prior to formulation of the developer solution, all glassware was rinsed three times with isopropyl alcohol and baked at 100° C. for 24 h. Preparation took place in a fume hood. A known volume of 2-heptanone (EUVR developer, TOK America, 100-300 ppm $H_2O$) was dispensed into a glass bottle. A volume required to achieve the target 2 vol % of 1,2-hexanediol additive was then added to the bottle via graduated cylinder or autopipette to prepare developer solution HD2). The solution was capped and placed on a shaker table to thoroughly mix.

Wafers were coated, exposed, developed, rinsed, and analyzed according to Example 2.

Twelve wafer samples were processed at a post-exposure bake temperature of 160° C. and then developed with developer solution (HD2). Following development, one of four rinse conditions was used.

The microbridge defect analysis methodology described in Example 2 was applied to the resulting line-space patterns using a 16-nm target CD. The mean fitted defect count per 150 images for a 16p32 field is plotted for the three wafers in each rinse condition in FIG. 18. The error bars in the figure represent plus or minus one standard deviation. Rinse Condition (A) was no rinse. Rinse Condition (B) was a 10 second rinse with solution (HF0). Rinse Condition (C) was a 10 second rinse with solution (HD2). Rinse Condition (C) was a 10 second rinse with solution (HF0), followed by a 10 second rinse with solution (HD2).

As shown in FIG. 18, Rinse Condition (B) resulted in the highest defectivity and variability. Rinse condition (D), a two-step rinse using (HF0) then (HD2), was found to reduce defects relative to Rinse Condition (B). The elimination of the rinse step, Rinse Condition (A), resulted in a greater than three-fold reduction in defectivity as compared to Rinse Condition (B), with a relative standard deviation of ~14%. Rinse Condition (C) resulted in the lowest number of defects per 150 images as well as a reduction in wafer-wafer variability.

This example shows that a single rinse with the diol-containing solution (HD2) reduces microbridging defects as compared to no rinse and a rinse with a solvent absent the diol-additive. Surprisingly, the single rinse with the diol-containing solution rinse resulted in significantly less defects than a two-step rinse in which the diol-containing solution (HD2) was used as the second step.

Example 11. PGMEA and Acetic Acid Developer Compositions with Hexagonal Pillar Patterns This example demonstrates the improved performance for hexagonal pillar patterning obtained with acetic acid as a developer additive. Organotin oxide hydroxide photoresist hexagonal pillar patterns are developed with developer solutions using a blend of PGMEA with acetic acid and compared to a 2-heptanone developer solution. A significant reduction in microbridge defects is demonstrated with the use of high-resolution imaging.

Organotin oxide hydroxide photoresist precursor solutions and photoresist films were prepared and processed as described in Example 2 with the exception that following PAB, the following process was used to expose and pattern the resist-coated substrates. A hexagonal array of 23-nm diameter pillars on a 40-nm vertical and 70-nm horizontal pitch was projected on each coated wafer at a fixed focus using an ASML NXE:3300B EUV scanner with numerical aperture of 0.33 and hexapole illumination. The wafer was stepped after each exposure to create an approximately annular array of fields about the center of the wafer with varied exposure doses.

Figure 19:
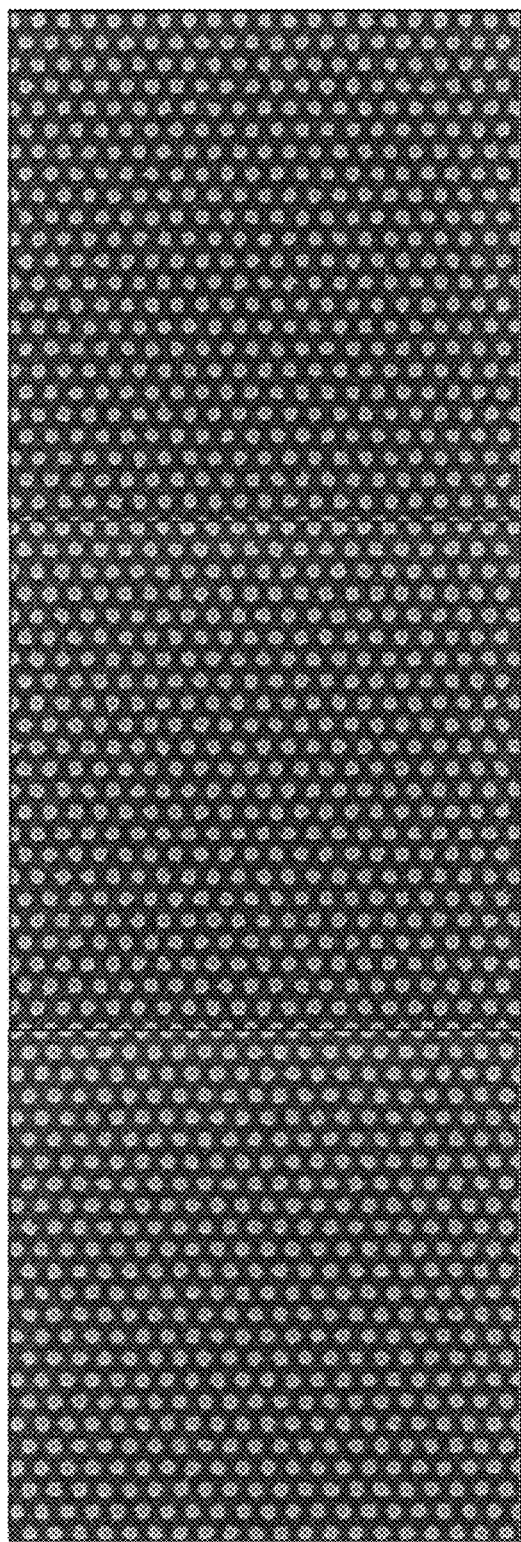
FIG. 19 is a plot of shows representative SEM images and performance data for organometallic resist patterned via EUV lithography to form a hexagonal pillar pattern of 23-nm diameter pillars and processed with (left) post-exposure bake temperature of 170° C. and 2-heptanone developer, (middle) post-exposure bake temperature of 190° C. and 2 vol % acetic acid in PGMEA developer, (right) post-exposure bake temperature of 190° C. and 5 vol % acetic acid in PGMEA developer.

Developer solutions (PA2) and (PA3) were prepared by mixing acetic acid and PGMEA as described in Example 5. All wafers were rinsed with their corresponding developer solution. The developer solutions were tested on wafers processed with PEBs of 170° C. and 190° C. and compared with (HF0). FIG. 19 shows representative SEM images near $E_{size}$, (e.g. ~23 nm CD) for wafers processed with (a) a post-exposure bake temperature of 170° C. and (HF0) developer, (b) a post-exposure bake temperature of 190° C. and (PA2) developer, (c) a post-exposure bake temperature of 190° C. and (PA3) developer. FIG. 19 also presents $E_{size}$ values and image pillar 3-sigma LCDU (3 times the standard deviation of the pillar CDs measured per image). The microbridge defect analysis methodology described in Example 2 was adapted to detect microbridges between pillars using KOLONA (stylized KOΛONA), an image analysis software The mean fitted defect count per 150 images for a 27-nm CD pillar pattern printed on a 70x40y hexagonal grid is listed for each condition in FIG. 19. Wafers processed with a PEB of 190° C. and developed in solutions (PA2) and (PA3) were found to exhibit a substantially lower micro-bridge defectivity and image LCDU relative to a wafer processed at 170° C. and developed with solution (HF0). Improved patterning performance with the acetic acid containing developers as compared to (HF0) resulted even with a lower dose to size.

Example 12. Primary and Secondary Alcohol Developer Compositions

This example demonstrates the improved patterning performance obtained with a primary and a secondary alcohol as developer solutions. Organotin oxide hydroxide photoresist patterns are developed with the primary alcohol n-propanol and the secondary alcohol propylene glycol methyl ether and compared to 2-heptanone. A significant reduction in microbridge defects is demonstrated with the use of high resolution imaging.

Wafers were coated, exposed, developed, rinsed, and analyzed according to Example 2.

Developer solutions comprising neat solvents (HF0) (2-heptanone, TOK America), (PG0) (Propylene glycol methyl ether, PGME, Sigma Aldrich, 99.5%) and (NP0) (n-propanol, Sigma Aldrich 99.5%), were used as received by the manufacturer. Each of the 3 developer solutions was tested on wafers processed with a PEB of 160° C. and 180° C. All wafers were rinsed with their corresponding developer solution. The microbridge defect analysis methodology described in Example 2 was applied to the resulting line-space patterns using an 18-nm target CD printed by over-exposure of the projected 16p32 image.

Figure 21:
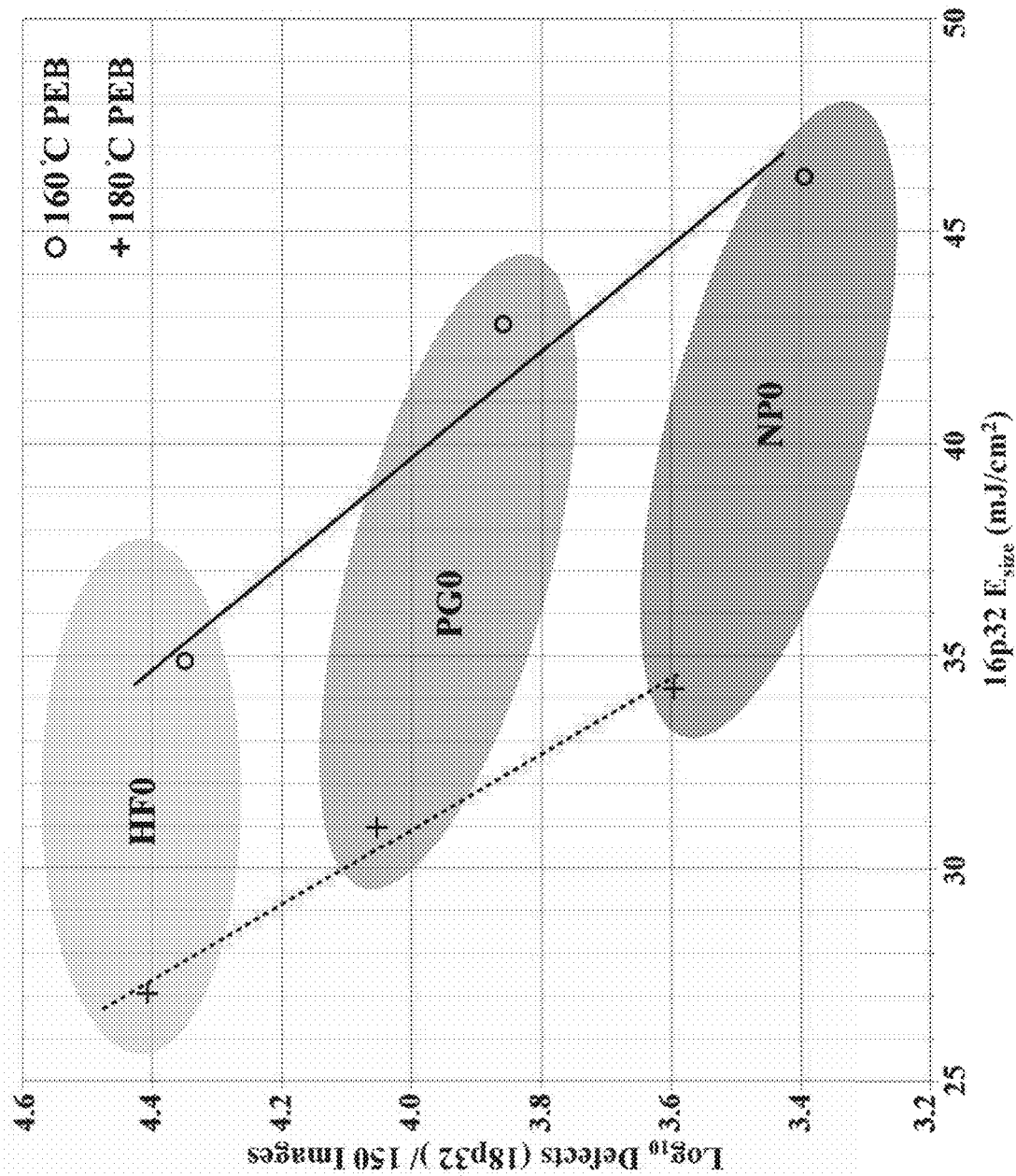
FIG. 21 is a log-linear plot of the estimated defect count per 150 images for an 18p32 pattern (Defects (18p32)/150 Images) as a function of the equivalent dose to size (16p32 $E_{size}$) for organometallic resist patterned via EUV lithography to form 32-nm pitch lines for developer compositions 2-heptanone (HF0), PGME (PG0), and n-propanol (NP0), at post-exposure bake (PEB) temperatures of 160° C. and 180° C.

Representative SEM images captured from the 32-nm pitch pattern field with an average line CD closest to 16 nm are presented for each wafer in FIG. 20. Projected dose (mJ $cm^{-2}$), line CD (nm), and LWR (nm) are shown for each image. An increase in dose, a reduction in LWR and an improvement in line quality in terms of visible microbridge defects at equivalent PEBs are generally observed for both (PG0) and (NP0) relative to (HF0). The (NP0) developer solution showed the larger increases in dose while (PG0) showed the larger improvements in line width roughness. FIG. 21 presents a log-linear plot of the number of defects counted per field for 18-nm lines on a 32-nm pitch as a function of the dose required to print 16p32 patterns from the same reticle field. A reduction in the number of microbridges is observed for both (PG0) and (NP0) at both 160° C. and 180° C. relative to (HF0). At approximately equal dose conditions (e.g. 180° C., NP0 vs. 160 C, HF0) (NP0) is found to afford a >5x reduction in microbridge density. These results show improved patterning performance with primary and secondary alcohols as compared to 2-heptanone, with the primary alcohol as a developer resulting in substantial reductions in microbridging defects.

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein. To the extent that specific structures, compositions and/or processes are described herein with components, elements, ingredients or other partitions, it is to be understand that the disclosure herein covers the specific embodiments, embodiments comprising the specific components, elements, ingredients, other partitions or combinations thereof as well as embodiments consisting essentially of such specific components, ingredients or other partitions or combinations thereof that can include additional features that do not change the fundamental nature of the subject matter, as suggested in the discussion, unless otherwise specifically indicated. The use of the term "about" herein refers to measurement error for the particular parameter unless explicitly indicated otherwise.

What is claimed is:

1. A method for developing a radiation exposed organometallic patterning layer with a latent image formed by exposed and non-exposed regions comprising an organometallic oxide/hydroxide network with exposed regions having increased hydrophilic character, the method comprising contacting the radiation exposed organometallic patterning layer with a developer composition comprising a solvent blend with from about 0.25 volume percent to about 45 volume percent alcohol, glycol ether, pyrrolidone, lactone or a combination thereof, and at least 55 volume percent ketone, ether, ester, or combinations thereof.

2. The method of claim 1 wherein the contacting step is performed using a puddle method, a dip method, a spin coating method, or a spray method wherein the developer composition is applied to the surface of the radiation exposed organometallic patterning layer and dried by spinning and/or blowing for a selected period of time from about 2 seconds to about 30 minutes.

3. The method of claim 1 further comprising rinsing the developed pattern with a rinse solution wherein the rinse solution comprises the developer composition.

4. The method of claim 1 further comprising baking the radiation exposed organometallic patterning layer at a temperature (PEB temperature) from about 120° C. to about 190° C. before contacting the radiation exposed organometallic patterning layer with the developer composition.

5. The method of claim 4 wherein a duration time of contacting, the PEB temperature, and the developer composition are selected to produce a desired feature size and/or defect rate of the developed patterned structure, wherein the duration time of contacting is from about 2 seconds to about 30 minutes.

6. The method of claim 1 wherein the developed patterned layer comprises a periodic array of lines and has an average line-width roughness that is no more than about 5 nm.

7. The method of claim 1 wherein the developer composition further comprises one or more property modifier additives wherein the developer composition comprises no more than about 5 weight percent of the additives.

8. The method of claim 1 further comprising:
either the step of depositing a material based on the developed patterned layer or etching the substrate based on the developed patterned layer; and
removing the developed patterned layer to form a processed substrate.

9. The method of claim 1 wherein the organometallic oxide/hydroxide network is represented by the formula $R_zSnO_{(2-(z/2)-(x/2))}(OH)_x$ where $0<z\le2$ and $0<(z+x)\le4$, in which R is a hydrocarbyl group with 1-31 carbon atoms or blends of hydrocarbyl groups each forming a carbon bond with the tin atom.

10. The method of claim 1 wherein the developer composition comprises 2-heptanone and/or PGMEA.

11. The method of claim 1 wherein the developer composition comprises cyclohexyl acetate, dibutyl oxalate, propylene glycol monomethyl ether acetate, ethyl acetate, ethyl lactate, n-butyl acetate, butyrolactone, methyl ethyl ketone, acetone, 2-butanone, cyclohexanone, 2-heptanone, 2-octanone, or combinations thereof.

12. The method of claim 1 wherein the developer composition comprises 1-ethyl-2-pyrrolidone, 2-butanone, 2-heptanone, diisobutyl ketone, 2-butanol, 2-heptanol, 4-methyl-2-pentanol, ethyl acetate, cyclohexyl acetate, dibutyl oxalate, methyl laurate, and/or PGMEA.

13. The method of claim 1 wherein the developer composition further comprises up to 10 vol % water additive.

14. The method of claim 1 further comprising forming the organometallic oxide/hydroxide network by depositing a precursor solution comprising one or more distinct compounds $RSnX_3$, wherein R is a hydrocarbyl group with 1-31 carbon atoms, and X is a ligand with a hydrolysable M-X bond or clusters thereof with appropriate ligand rearrangements.

15. The method of claim 14 wherein R comprises a blend of distinct hydrocarbyl groups.

16. The method of claim 1 further comprising forming the radiation exposed organometallic patterning layer by a method comprising:
coating a substrate with an organometallic radiation sensitive organometallic resist material to form a radiation sensitive organometallic resist layer on a surface of a substrate and
exposing the radiation sensitive organometallic resist layer to extreme ultraviolet radiation using a patterned mask to form the radiation exposed organometallic patterning layer comprising exposed portions and unexposed portions.

17. The method of claim 16 wherein the exposing the radiation sensitive organometallic resist layer comprises irradiation with extreme ultraviolet radiation at a dose of no more than about 200 mJ/cm$^2$ or with an electron beam at a dose no more than about 2 mC/cm$^2$ at 30 kV.

18. The method of claim 1 wherein the contacting results in negative tone image formation.

19. The method of claim 1 wherein the developer composition further comprises a carboxylic acid.

20. The method of claim 1 wherein the alcohol is a monohydroxyl alcohol, a diol, or a combination thereof.

* * * * *